United States Patent

Mukunoki et al.

[11] Patent Number: 5,828,615
[45] Date of Patent: Oct. 27, 1998

[54] REFERENCE POTENTIAL GENERATOR AND A SEMICONDUCTOR MEMORY DEVICE HAVING THE SAME

[75] Inventors: Toshio Mukunoki, Osaka; Hiroshige Hirano; George Nakane, both of Nara; Tetsuji Nakakuma; Tatsumi Sumi, both of Osaka; Nobuyuki Moriwaki, Kyoto, all of Japan

[73] Assignee: Matsushita Electric Industrial Co., Ltd., Osaka, Japan

[21] Appl. No.: 785,838

[22] Filed: Jan. 8, 1997

Related U.S. Application Data

[62] Division of Ser. No. 669,668, Jun. 24, 1996, abandoned, which is a continuation of Ser. No. 350,993, Nov. 29, 1994, abandoned.

[30] Foreign Application Priority Data

Mar. 22, 1994 [JP] Japan ..................................... 6-050271

[51] Int. Cl.$^6$ ....................................................... G11C 7/02
[52] U.S. Cl. ......................... 365/210; 365/145; 365/149; 365/203
[58] Field of Search ............................... 365/210, 189.09, 365/190, 149, 145, 203

[56] References Cited

U.S. PATENT DOCUMENTS

| | | | |
|---|---|---|---|
| 4,363,111 | 12/1982 | Heightley et al. | 365/210 |
| 5,010,518 | 4/1991 | Toda | 365/145 |
| 5,392,234 | 2/1995 | Hirano et al. | 365/145 |

Primary Examiner—David C. Nelms
Assistant Examiner—Son Mai
Attorney, Agent, or Firm—McDermott, Will & Emery

[57] ABSTRACT

A reference potential generator is constituted of two signal lines 21 and 22; a charge supplying means to supply charge to signal lines 21 and 22; a first connection circuit 24a and 24b connecting the charge supplying circuit 23 and two signal lines 21 and 22 in order to supply charge to the two signal lines; and a second connection circuit 25 connecting two signal lines 21 and 22 together by the second control signal, and two signal lines are disconnected after the potentials of the two signal lines determined by the supplied charge and each of load capacitances of signal lines are averaged. A semiconductor memory device of the invention incorporating the above reference potential generator generating an exact reference potential, is able to amplify and output the potential difference between the reference potential and the potential of data readout in the bit line, and by this, "1" or "0" of readout data can be precisely determined.

6 Claims, 28 Drawing Sheets

REFERENCE POTENTIAL GENERATOR AND A SEMICONDUCTOR MEMORY DEVICE HAVING THE SAME

This is a divisional of application Ser. No. 08/669,668, filed Jun. 24, 1996, now abandoned, which is a continuation application of Ser. No. 08/350,993, filed Nov. 29, 1994, now abandoned.

FIELD OF THE INVENTION

This invention relates to a reference potential generator to be incorporated in electronic equipments and a semiconductor memory device having the same.

BACKGROUND OF THE INVENTION

In electronic circuits, particularly in digital circuits, it is highly important to have a circuit which can differentiate a signal of "1" from a signal of "0" based on a reference potential. For instance, in a semiconductor memory device, a data read out from a memory cell has to be classified into either "1" or "0".

For this purpose, according to a developed method, a reference potential is given to one bit line of paired bit lines in which data are read out, and the reference potential and the readout data are compared to determine if the readout data is "1" or "0".

However, with the advancements of high density and high integration semiconductor fabrication technologies, modern semiconductor memory devices are now constituted of extremely miniaturized transistors and memory cell capacitors.

Therefore, the amount of charge storable in the memory cell capacitor is small, and the potential difference necessary to differentiate the data "1" from "0" is very small. Thus, in order to secure the reliability of data obtained from semiconductor memory devices, it is necessary to provide a highly accurate reference potential.

Moreover, since the semiconductor memory device consists mainly of dynamic random access memory (DRAM) devices wherein charge is stored in memory cell capacitors disposed therein, and data is expressed in terms of the charge in individual memory cell capacitors. Though the dielectric layer of memory cell capacitor had been made mainly of a silicon oxide layer, a semiconductor memory device using a ferroelectric layer has been developed in order to attain a nonvolatile memory device wherein the data can be memorized without extinction.

A semiconductor memory device provided with a conventional reference potential generator is now explained below.

FIG. 27 shows a circuit construction of conventional semiconductor memory device, and FIG. 28 shows an operational timing chart. FIG. 29 shows a hysteresis characteristics of ferroelectric layer which is used in a memory cell capacitor of conventional semiconductor memory device, and FIG. 30 shows a hysteresis characteristics of ferroelectric layer which is used in a reference cell capacitor of conventional semiconductor memory device.

As shown in FIG. 27, bit lines 3 and 4 are connected to sense amplifier 7, and each of the bit lines 3 and 4 is connected to memory cells 8a, 8b, 8c, 8d, and 8e and reference cells 9 and 10. Memory cell 8a is constituted of MOS transistor 11 and memory cell capacitor 13, and the gate of MOS transistor 11 is connected to word line 1. The drain thereof is connected to bit line 3, and the source thereof is connected to the first electrode of memory cell capacitor 13 while the second electrode of memory cell capacitor 13 is connected to cell plate electrode 5.

Likewise, reference cell 9 is constituted of MOS transistor 12 and reference cell capacitor 14. The gate of MOS transistor 12 is connected to reference word line 2, the drain thereof is connected to bit line 4, and the source thereof is connected to the first electrode of reference cell capacitor 14 while the second electrode of reference cell capacitor 14 is connected to reference cell plate electrode 6.

In this semiconductor memory device, reference potentials are generated by reference cells 9 and 10, and the reference potential generated by reference cell 9 is supplied to bit line 4, and the reference potential generated by reference cell 10 is supplied to bit line 3.

In this case, since the potential difference between these two reference potentials should be negligibly small, the dielectric layers of these reference cells capacitors have to be fabricated to have an extremely uniform area and thickness by applying a highly strict manufacturing process.

Then, by referring FIGS. 28 to 30, the operations of conventional semiconductor memory device are explained next. In FIGS. 29 and 30, the horizontal axes show an electric field applied to memory cell capacitor 13, and the vertical axes show charge produced by this. As shown in FIGS. 29 and 30, a residual polarization encircled by point B, point E, point K, and point H, exists even when the applied electric field is zero.

Therefore, a nonvolatile semiconductor memory device can be fabricated by utilizing this residual polarization left in the ferroelectric capacitor as a nonvolatile data. Moreover, the memory cell capacitor 13 is at a state of point B when the data in memory cell 8a is "1", and it is in a state of point E when the data in memory cell 8a is "0", providing the initial condition of reference cell capacitor 14 is at a state of point K.

Then, the data read out from memory cell 8a is explained next. As an initial condition, the bit lines 3 and 4, word line 1, reference word line 2, cell plate electrode 5, and the reference cell plate electrode 6 are set at a logical state of "L" (low level), and after this, bit lines 3 and 4 are set at a floating condition.

The word line 1, reference word line 2, cell plate electrode 5, and the reference cell plate electrode 6 are then set at a logical state of "H" (high level). Since MOS transistors 11 and 12 are set at ON at that time, an electric field is applied on the memory cell capacitor 13 and reference cell capacitor 14. Thus, when the data in memory cell 8a is "1", the state of memory cell capacitor 13 shown in FIG. 29 is shifted from point B to point D, and the charge Q1 is read out in bit line 3.

On the other hand, when the data in memory cell 8a is "0", the state of memory cell capacitor 13 is shifted from point E to point D, and the charge Q0 is read out in bit line 3. The data in memory cell 8 is read out by amplifying the potential difference between the potential of bit line 3 in which the data stored in memory cell 8a is read out and the potential of bit line 4 in which the data stored in the reference cell 9 is read out by sense amplifier 7.

Since the potentials of bit line 3 and cell plate electrode 5 are in a state of "H" after the data "1" is read out from memory cell 8a, no electric field is applied to memory cell capacitor 13, shifting the state of memory cell capacitor 13 to point E.

In order to shift the data state of memory cell capacitor 13 back to point B after this, cell plate electrode 5 is set at "L", and word line 1 is then set at "L" after state of memory cell capacitor 13 is set at a state of point A. Since no electric field is applied to memory cell capacitor 13 when word line 1 is set at "L", it is brought back to a state of point B.

Likewise, since bit line 3 is in a state of "L" and cell plate electrode 5 is in a state of "H" after the data "0" in memory cell 8a is read out, the memory cell capacitor 13 is at a state of point D. Then, after this, since the electric field applied to memory cell capacitor 13 becomes zero by setting cell plate electrode 5 at "L", memory cell capacitor 13 is set at a state of point E. Although word line 1 is set at "L" afterward, the memory cell capacitor 13 is maintained at a state of point E since it is maintained at a state of no applied electric field.

On the other hand, as for the reference cell 9, reference cell capacitor 14 is at a state of point J shown in FIG. 30 since bit line 4 is set at "L" and cell plate electrode 6 is set at "H" when the data in memory cell 8a is "1".

When reference word line 2 and reference cell plate electrode 6 are set at "L" at the same time afterward, the state of reference cell capacitor 14 is shifted back to point K since the state of reference cell capacitor 14 with no applied electric field is unchanged.

Likewise, when the data of memory cell 8a is zero, the state of reference cell capacitor 14 is situated at point K since bit line 4 and cell plate electrode 6 are in a state of "H". When reference word line 2 and reference cell plate electrode 6 are set at "L" simultaneously afterward, the state of reference cell capacitor 14 is at point K since the state of reference cell capacitor 14 with no applied electric field is unchanged.

However, in the above shown semiconductor memory device, deviations of reference potentials are often produced by the deviations of area and thickness or other factors of the ferroelectric layer since reference cell 9 provided to generate a reference potential is constituted of only one MOS transistor 12 and reference cell capacitor 14.

Moreover, right after the fabrication of reference cell capacitor, it may take any state other than that of point K. For instance, when it were at point H in its initial condition, an erratic operation in performing its very first readout operation, is possible.

Moreover, since reference word line 2 and reference cell plate electrode 6 are set at "L" simultaneously after the charge read out from bit line 3 is amplified by sense amplifier 7, the parasitic capacitance of reference word line 2 is inevitably large. Furthermore, when the fall down period of reference word line 2 is longer than the fall down period of reference cell plate electrode 6, the bit line 4 would be set at "H" and the reference cell plate electrode 6 would be set at "L" when the data in memory cell 8a is "0", and at this time, the state of reference cell capacitor 14 set at point G.

When the reference cell plate electrode 6 is set at "L" afterward, the state of reference cell capacitor 14 is set at point H shown in FIG. 30. Therefore, an erratic operation is possible at the succeeding readout operation since the state of reference cell capacitor 14 is not set at point K which represents the initial state.

Moreover, since the rises and the falls of word line 1, reference word line 2, cell plate electrode 5, and reference cell plate electrode 6 are performed simultaneously, problems of power concentration are inevitable.

SUMMARY OF THE INVENTION

The purposes of this invention are to offer a reference potential generator supplying an exact reference potential, and at the same time, and a semiconductor memory device incorporating the reference potential generator delivering precise data output consistently.

The invented reference potential generator comprises a pair of signal lines, a charge supplying means supplying charge to the signal lines, a first connecting means with switching function connected between each of the signal lines and the charge supplying means, and a second connecting means with switching function connected between the two signal lines.

The invented semiconductor memory device comprises a memory cell, bit lines to read out data from the memory cell, the above mentioned reference potential generator, and a sense amplifier to amplify a potential difference between the potential of data read out from the memory cell and the potential of the reference potential generator.

The invented reference potential generator is able to deliver an exact and stable reference potential, and the semiconductor memory device provided with the reference potential generator is capable of delivering exact data from the sense amplifier amplifying the potential difference between the potential of data read out from the memory cell and the exact reference potential.

DESCRIPTION OF THE PREFERRED EMBODIMENTS

Embodiment-1

Figure 1:
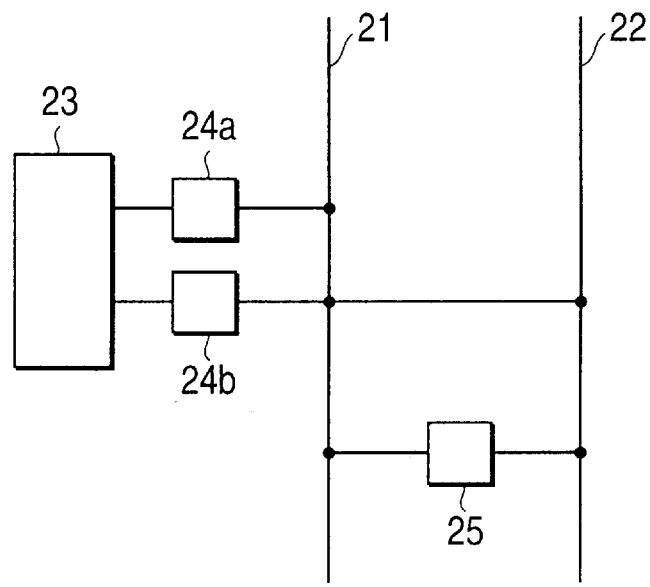
FIG. 1 shows a circuit block diagram of reference potential generator which is a first embodiment of the invention.

A reference potential generator shown in FIG. 1 is now explained below.

The reference potential generator shown here, comprises signal lines 21 and 22, charge supplying circuit 23, the first switch circuits 24a and 24b connected between signal lines 21 and 22 and charge supplying circuit 23, and the second switch circuit 25 connected between the signal lines 21 and 22.

At first, a charge is supplied to each of signal lines 21 and 22 from charge supplying circuit 23 through each of switch circuits 24a and 24b. After this, first switch circuits 24a and 24b are disconnected.

At this state, if the parasitic capacitances, electrical resistances, and others of signal lines 21 and 22 are equal, and an equal charge is supplied to each signal line from charge supplying circuit 23, the potentials generated in signal lines 21 and 22 should be equal. However, if the parasitic capacitances and electrical resistances of these lines are unequal, the potentials produced between the signal lines would be different even if an equal charge is supplied.

In this case of such, the second switch circuit 25 is set at ON in order to connect the signal lines 21 and 22 together in order to equalize the potentials of these. Moreover, when different amounts of charge are supplied from charge supplying circuit 23 to the signal lines 21 and 22 of a same electrical resistance and parasitic capacitance, a potential of which magnitude is proportional to the amount of charge is generated in each of the signal lines 21 and 22. In this embodiment of the invention, these potentials are equalized by setting the second switch at ON, yielding an averaged potentials between these two signal lines.

Therefore, when this averaged potential is utilized as a reference potential, comparison of the potentials should be easily performed since this potential is in-between two potentials of signal lines 21 and 22 obtained before the switch circuit 25 is set at ON.

Embodiment-2

A semiconductor memory device in which the reference potential generator shown in Embodiment-1 is incorporated is described below.

The semiconductor memory device comprises bit lines 31, 32, 33, 34, memory cells 30a, 30b, 30c connected to them, charge supplying circuits 35a and 35b, switch 36a connecting charge supplying circuit 35a and bit line 33, switch 36b connecting charge supplying circuit 35b and bit line 34, switch 37 connecting bit lines 33 and 34 together, and sense amplifier 38 amplifying the potential difference between the bit lines 31 and 32. Moreover, the part constituted of bit lines 33 and 34, charge supplying circuits 35a and 35b, and switches 36a, 36b, 37 is a reference potential generating means corresponding to the reference voltage generator shown in Embodiment-1.

An operation of the semiconductor memory device is explained below, providing that data are written in memory cells 30a, 30b, 30c, in advance.

At first, each of the bit lines 31, 32, 33, 34 is precharged at a fixed potential such as the ground potential, and switches 36a and 36b are set at ON in order to supply charges to bit lines 33 and 34 from charge supplying circuits 35a and 35b. As a result of this, the potentials of bit lines 33 and 34 are set at values determined by the charge supplied to each of the bit lines and the load capacitances of the bit lines.

Then, switches 36a and 36b are set at OFF and switch 37 is set at ON in order to transfer the charge between the bit lines 33 and 34. This charge transfer is continued until the bit line charges are equalized at a potential determined by the charge and the load capacitances of bit lines. Thus, the potentials of bit lines 33 and 34 are equalized at an intermediate potential between the bit line potentials obtained before switch 37 is set at ON.

In next, switch 37 is set at OFF. When the load capacitances of bit lines 31, 33, 34 are equalized, an amount of charge necessary to read out data "0" is supplied to bit line 33 from memory cell 30a, and an amount of charge necessary to read out data "1" is supplied to bit line 34 from memory cell 30a, and an intermediate potential of these potentials is produced in bit lines 33 and 34. By using this potential as a reference potential, the data readout operation is conducted then.

Moreover, in the above shown operations, though the timing between the switches 36a and 36b, is shifted from the timing of switch 37, there should be no problems if these are operated simultaneously.

Since both bit lines 31 and 32 are precharged at ground potential, data in memory cell 30a can be read out into bit line 31, the potential of bit line 33 or bit line 34 is transferred to bit line 32, and the potential difference between bit lines 31 and 32 is amplified by sense amplifier 38. Thus, depending on the potential of bit line 31, if it is higher than the potential of bit line 32, data "1" or data "0" is outputted from sense amplifier 38.

As above described, in this embodiment of the invention, a reference potential having a magnitude intermediate between the potential of bit line 31 obtained by reading data "0" and the potential of bit line 31 obtained by reading data "1" can be obtained. Since the readout data is compared with this reference potential to determine if the readout data is "1" or "0", data can be read out more precisely.

A case where the charge supplying circuits 35a and 35b are replaced by capacitors, and the switches 36a and 36b are replaced by MOS transistors is explained next. These capacitors are precharged, and the potentials generated between the capacitor electrodes are maintained so long as the MOS transistors are set at OFF, while the charge stored in the capacitors are supplied to bit lines 33 and 34 by setting the MOS transistor at ON.

At this time, the charge transfer is stopped as soon as the potentials of bit lines 33 and 34 are equalized with the potentials between the capacitor electrodes, and potentials are generated at bit lines 33 and 34. The operations conducted after the charge supply are same as the above described ones.

A case where the memory cells 30a, 30b, 30c are constituted of MOS transistors and capacitors, and the capacitors constituting charge supply circuits 35a and 35b are capacitors having a design and capacitances same as those of the capacitors of memory cell 30a, 30b, 30c, is then considered. In this case, in order to supply the charge obtained by reading data "0" or "1" from the memory cells 30a, 30b, 30c to bit lines 33 and 34, charge same as the charge necessary to write data "0" or "1" into memory cells 30a, 30b, and 30c have to be stored in the capacitors of charge supplying circuits 35a and 35b. In another words, by writing "H" into one of the capacitors of the charge supplying circuits 35a and 35b, and "L" into the other capacitor, respective charge had to be supplied to bit lines 33 and 34. A reference potential can be obtained by averaging these two potentials derived from these charge.

Moreover, even if deviations of capacitor dimensions and capacitances produced during the manufacturing process of those capacitors, capacitors of memory cells 30a, 30b, and 30c and capacitors of charge supplying circuits 35a and 35b are subjected to the same deviations. Therefore, there should be no deviations of the reference potential from the intermediate potential determined between the potential obtained by reading data "0" and the potential obtained by reading data "1".

However, on the other hand, when the memory cells and charge supplying circuits are constituted of capacitors of different capacitances, the effects of deviations produced during the manufacturing processes of these would be different depending on the capacitors. Therefore, the deviations of charge supplies may be larger, and larger deviations of reference potential from the intermediate potential are possible.

When the memory cells 30a, 30b, and 30c and the charge supplying circuits 35a and 35b are constituted of ferroelectric capacitors, data can be read out by generating a reference potential by using the above shown method. Moreover, a nonvolatile memory device can be obtained in this case, since data are memorized in these ferroelectric capacitors by utilizing spontaneous polarization thereof.

Embodiment-3

Figure 2:
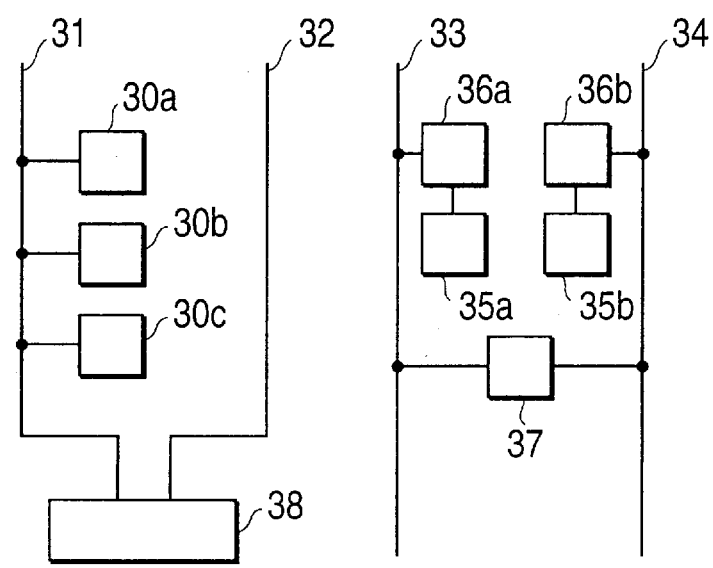
FIG. 2 shows a circuit block diagram of semiconductor memory device which is a second embodiment of the invention.
Figure 3:
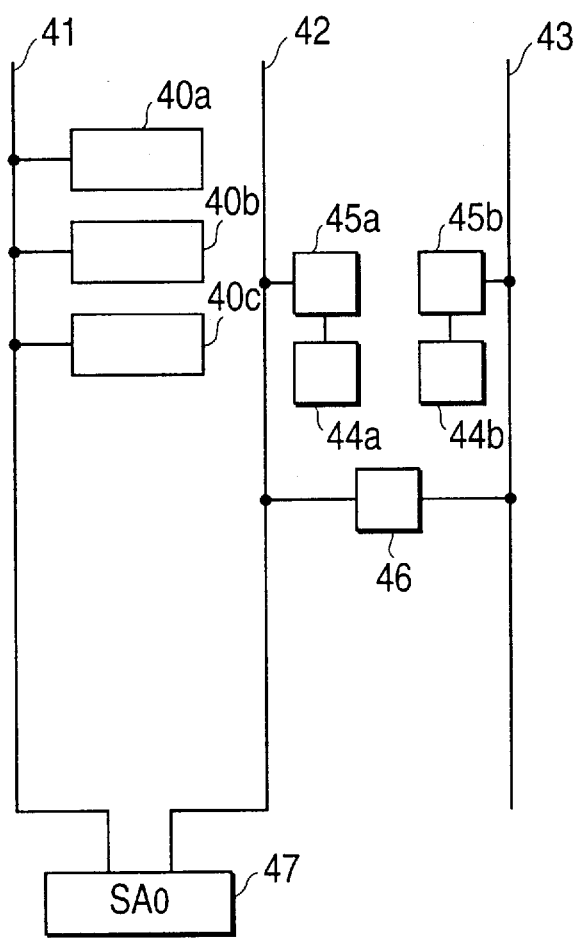
FIG. 3 shows a circuit block diagram of semiconductor memory device which is a third embodiment of the invention.

The semiconductor memory device shown in FIG. 3 is a modification of Embodiment-2. The difference of Embodiment-3 from Embodiment-2 is its circuit construction simplified further by connecting bit lines 32 and bit line 33 in common as shown in FIG. 2.

The operations of the semiconductor memory device are now explained below, providing that data are written in memory cells 40a, 40b, and 40c in advance.

First, the bit lines 41, 42, and 43 are precharged at a predetermined potential such as the ground potential, and then, charges are supplied from charge supplying circuits 44a and 44b to bit lines 42 and 43 by setting the switches 45a and 45b at ON. As a result of this, the potentials of bit lines 42 and 43 can be determined by each of the supplied charges and each of the load capacitances of the bit lines.

Then, by setting switch 46 at ON, charge transfer and redistribution are performed between the bit lines 42 and 43, and as a result of this, the potentials of bit lines 42 and 43 are averaged into a potential taking an intermediate potential between the potentials of bit lines 42 and 43 obtained before switch 46 is set at ON.

The bit line 42 can be disconnected from bit line 43 by setting switch 46 at OFF. Although switches 45a and 45b and switch 46 are set at ON individually here, those can be set at ON simultaneously without problems. By this, a reference potential can be generated in bit line 42.

The charge stored in memory cell 40a is then read out into bit line 41 by using a method employed to read the charge stored in memory cell 40a. The potential of bit line 41 is determined by the read charge and the load capacitance of bit line 41 in this case.

The reference potential in this case can be adjusted by changing the load capacitances of bit lines 42 and 43 and the amount of charge supplied thereto. For instance, the reference potential can be set at a potential intermediate between the potential of bit line 41 obtained by reading data "0" stored in the memory cell, and the potential of bit line 41 obtained by reading data "1" through the charge transfer and redistribution processes. Then, data can be outputted from the sense amplifier 47 by amplifying the potential difference between the reference potential generated in bit line 42 and the potential of bit line 41.

As above described, the circuit of Embodiment-3 is substantially simplified over the one of Embodiment-2. However, exact data readout can be obtained with this embodiment since the potential of bit line in which the data from memory cell is read out is compared with an intermediate potential between the potential of bit line in which data "1" is readout and the potential of bit line in which data "0" is readout.

Embodiment-4

Figure 4:
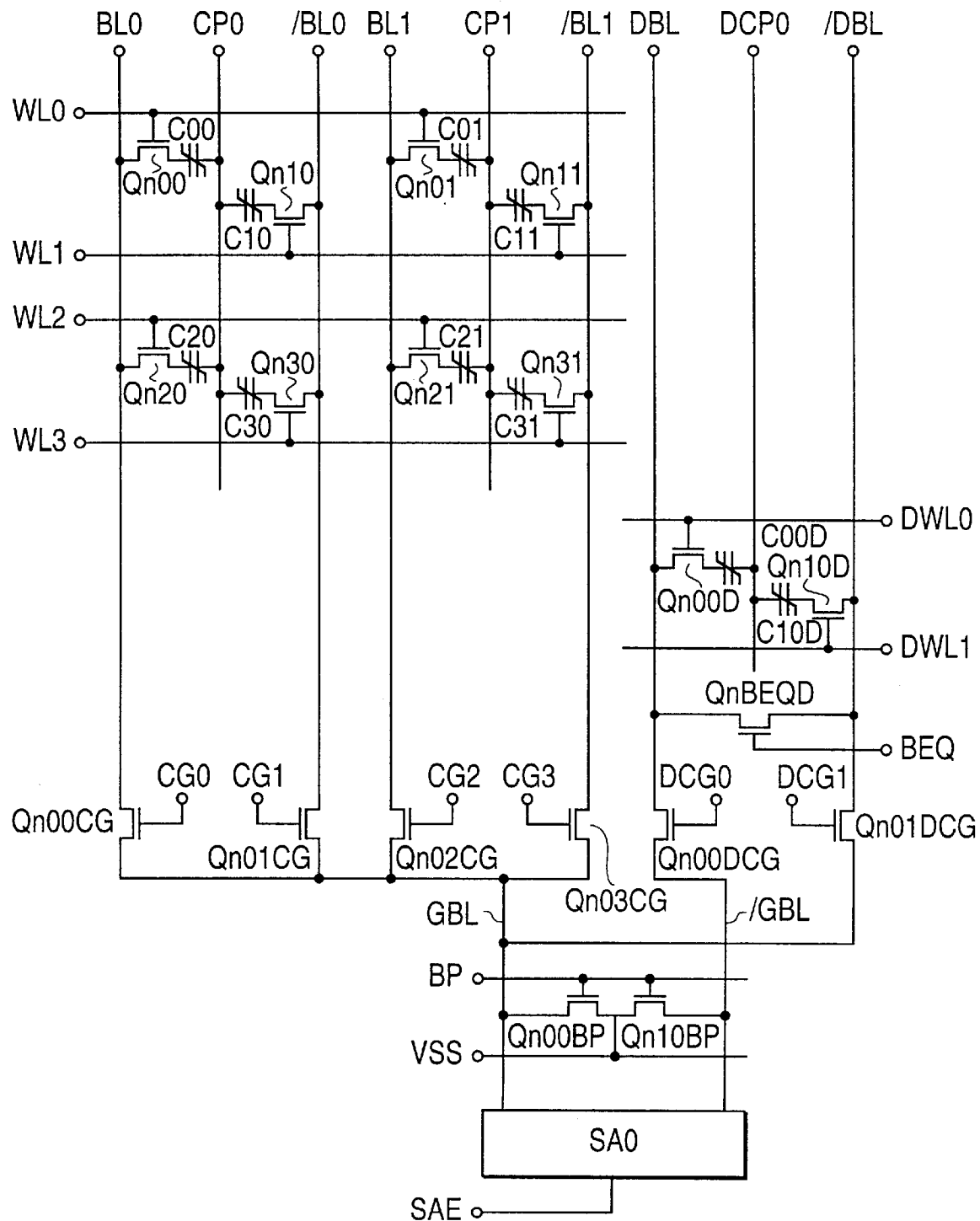
FIG. 4 shows a circuit construction of semiconductor memory device which is a fourth embodiment of the invention.

The semiconductor memory device shown in FIG. 4 corresponds to a memory device of which bit line 41 shown in Embodiment-3 consists of plural bit lines.

In FIG. 4, the logical potentials of bit lines /BL0 and /BL1 are the inverted logical potentials of bit lines BL0 and BL1 when data are read out therein from memory cells. The cell plate electrodes CP0 and CP1 are disposed in parallel to said bit lines, and the word lines WL0, WL1, WL2, and WL3 are disposed to cross said bit lines at right angle.

Moreover, the ferroelectric capacitors C00, C10, C20, C30, C01, C11, C21, C31 constituting the memory cells and the MOS transistors Qn00, Qn10, Qn20, Qn30, Qn01, Qn11, Qn21, Qn31 are connected to these signal lines.

The MOS transistors Qn00CG, Qn01CG, Qn02CG, and Qn03CG are to select plural bit lines and to connect the selected bit lines to sense amplifier SA0. The column gate signals CG0, CG1, CG2, CG3 are to select the columns of memory cell.

The reference cell is constituted of bit lines DBL and /DBL generating reference potentials, cell plate electrode DCP0, word lines DWL0 and DWL1, ferroelectric capacitors C00D and C10D, and MOS transistors Qn00D and Qn01D.

The MOS transistor QnBEQD connecting or disconnecting bit line DBL and bit line /DBL by means of equalizing signal BEQ, and the MOS transistor Qn00DCG and Qn01DCG connecting a selected bit line of reference cell to sense amplifier SA0, are connected to the reference cell.

The columns of reference cell are selected by column gate signal DCG0 and DCG1, and global bit line GBL is connected to the memory cell while global bit line /GBL is connected to the reference cell.

The MOS transistors Qn00BF and Qn10BF are to set the bit lines GBL and /BGL at ground potential simultaneously, and are controlled by the bit line precharge signal BP. The sense amplifier SA0 connected to bit lines GBL and /GBL is controlled by control signal SAE.

In this memory device, one memory cell consists of two memory cell capacitors C00 and C10 and two MOS transistors Qn00 and Qn10. One reference cell generating a reference potential consists of two reference cell capacitors C00D, C10D and two MOS transistors Qn00D, Qn10D. The reason for the parallel disposition of cell plate electrode CP0 to the bit lines is that there is one sense amplifier and only a predetermined memory cell among plural memory cells selected by a word line is operated.

Figure 5:
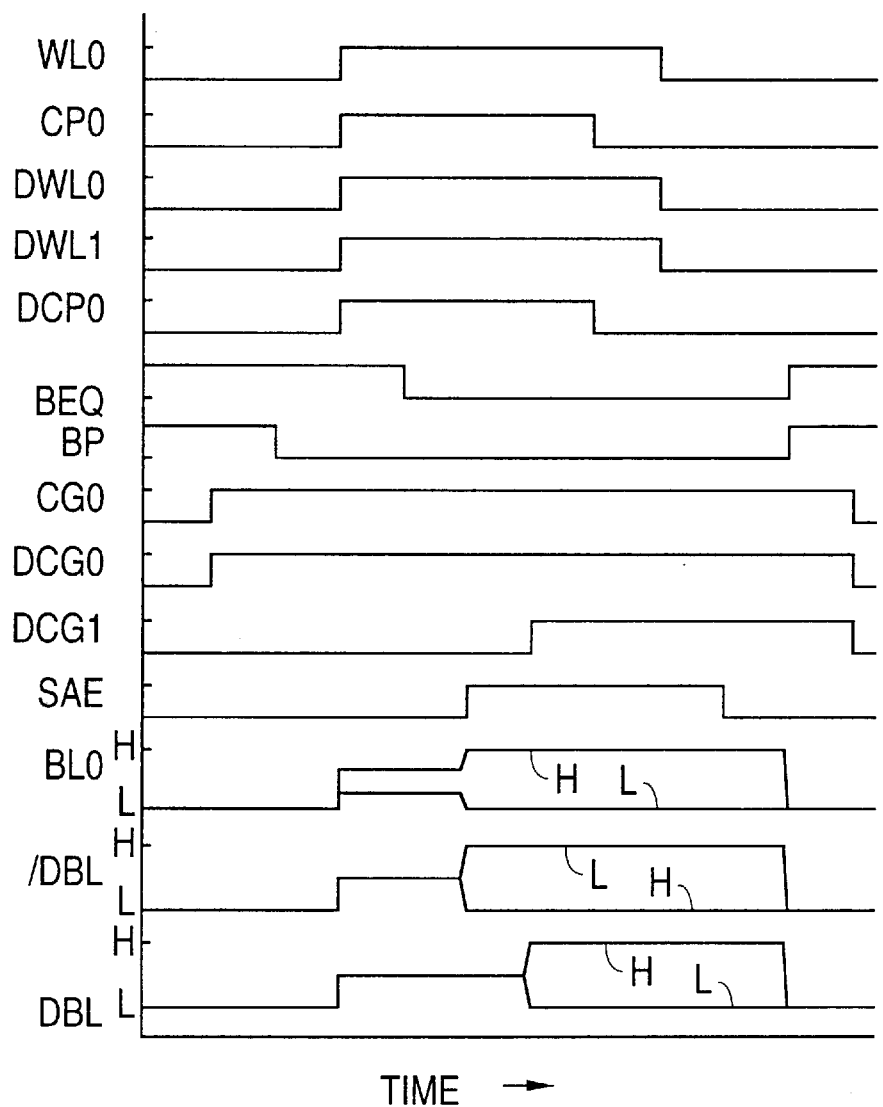
FIG. 5 shows an operational timing chart thereof.

The operations of this semiconductor memory device are now explained below by referring FIG. 5, providing that data "1" is written in memory cell capacitor C00, data "0" is in memory cell capacitor C10, data "1" is in reference cell capacitor C00D, and data "0" is in reference cell capacitor C10D respectively in advance.

At first, while equalizing signal BEQ and precharge signal BP are set at "H" and the MOS transistors QnBEQD, Qn00BP and Qn10BP are set at ON, the global bit lines GBL and /GBL are set at ground potential. Then, the column gate signals CG0 and DCG0 are set at "H", and the MOS transistors Qn00CG and Qn00DCG are set at ON. By these, bit lines BL0 and /DBL are set at ground potential. Then, global bit line GBL is disconnected from global bit line /GBL by setting the precharge signal BP at "L".

All of the word lines WL0, DWL0, and DWL1 and the cell plate electrodes CP0 and DCP0 are then set at "H", and by this, data "1" is read into bit line BL0 from memory cell capacitor C00. Moreover, data "1" is read into bit line /DBL and data "0" is read into bit line DBL. At this time, the potentials of bit lines DBL and /DBL are averaged since MOS transistor QnBEQD is in a state of ON.

Thus, an averaged potential, that is, a reference potential shows up in each of the bit lines. Therefore, a potential corresponding to data "1" shows up in global bit line GBL, and a potential corresponding to an average of data "1" and data "0" shows up in global bit line /GBL. The difference between these two potentials is amplified and outputted by sense amplifier SA0.

The rewriting operation is explained next. Data "1" is returned to global bit line GBL and data "0" is returned to global bit line /GBL from the sense amplifier SA0.

At this time, by changing the cell plate CP0 into "L" while word line WL0 is kept at "H", data "1" can be rewritten in the memory cell capacitor C00. Moreover, since MOS transistor Qn00DCG is in a state of ON, data "0" can be rewritten in the reference cell capacitor C00D through global bit line /GBL and bit line /DBL by setting column gate signal DCG1 at "H" and MOS transistor Qn01DCG at ON. Furthermore, data "1" can be rewritten in the reference cell capacitor C01D through global bit line GBL and bit line DBL.

Moreover, although the above shown rewriting operations are carried out by using the data of the paired bit lines connected sense amplifier SA0, those can be carried out as well through a circuit dedicated for rewriting only.

As above described, the semiconductor memory device of the invention has a simplified circuit construction consisting of memory cells disposed in a matrix form and reference cells by which reference potentials are generated. As for that a potential corresponding to an average of data "0" and data "1" is generated as a reference potential, and that the difference between the reference potential and the potential of readout data is amplified by sense amplifier SA0, this embodiment of the invention is identical with Embodiments-2 and -3. Therefore, precise data readout and rewrite to memory cells can be performed.

Embodiment-5

Figure 6:
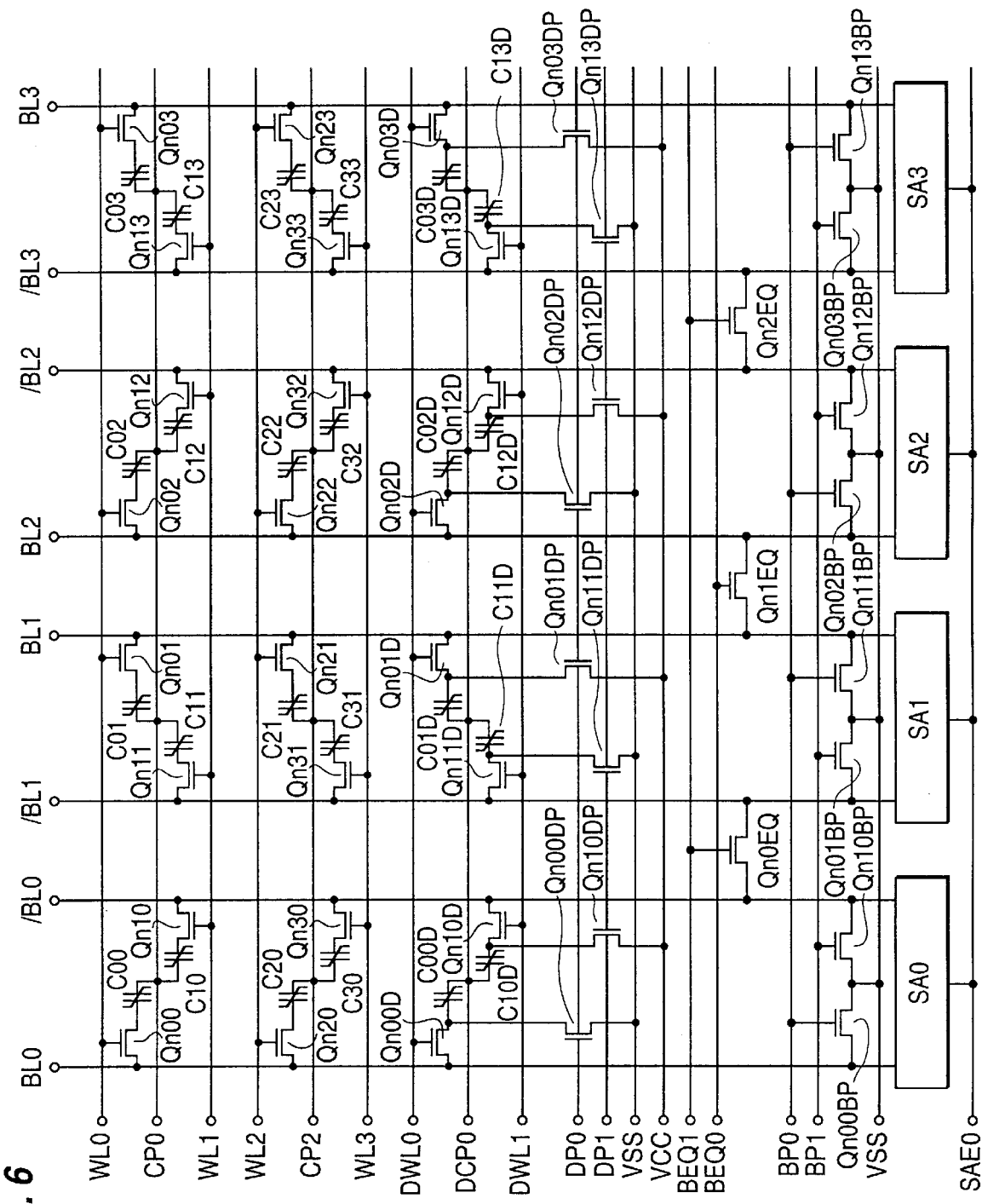
FIG. 6 shows a circuit construction of semiconductor memory device which is a fifth embodiment of the invention.

The semiconductor memory device shown in FIG. 6 is an embodiment developed from Embodiment-2, and is provided with two paired bit lines each corresponding to bit lines 31 and 32 shown in FIG. 2, and a reference potential generator between said paired bit lines.

A fundamental circuit construction of Embodiment-5 is now explained in respect of paired bit lines BL0 and /BL0 shown in FIG. 6 wherein a memory cell is constituted of two memory cell capacitors C00 and C10 paired with two MOS transistors Qn00 and Qn10. The drain of MOS transistor Qn00 (Qn10) is connected to bit line BL0 (/BL0), the gate is to word line WL0 (WL1), and the source is to the first electrode of memory cell capacitor C00 (C10) respectively, while the second electrode of memory cell capacitor C00 (C10) is connected to cell plate electrode CP0. The MOS transistors Qn20 and Qn30 and the memory cell capacitors C20 and C30 are connected together likewise.

The reference cell is constituted also of a combination of reference cell capacitors C00D and C10D and MOS transistors Qn00D and Qn10D. The drain of MOS transistors Qn00D (Qn10D) is connected to bit lines BL0 (/BL0), the gate is to word line DWL0 (DWL1) of the reference cell, and the source is to the first electrode of reference cell capacitor C00D (C10D) respectively, while the second electrode of reference cell capacitor C00D (C10D) is connected to cell plate electrode DCP0.

The bit lines BL0 and /BL0 are connected to sense amplifier SA0 which is controlled by sense amplifier control signal SAE0, and is operated when the control signal SAE0 is "H". The bit line BL0 is connected to ground potential Vss through MOS transistor Qn00BP of which gate is controlled by precharge signal BP0, while the bit line /BL0 is connected to ground potential Vss through MOS transistor Qn10BP of which gate is controlled by precharge signal BP1.

In this invented semiconductor memory device, plural bit line pairs each of which is identical with the bit line pair comprised of bit lines BL0 and /BL0 are disposed, and each of said bit line pairs are interconnected through MOS transistors Qn0EQ and Qn1EQ controlled by equalizing signal BEQ0 or BEQ1.

Figure 7:
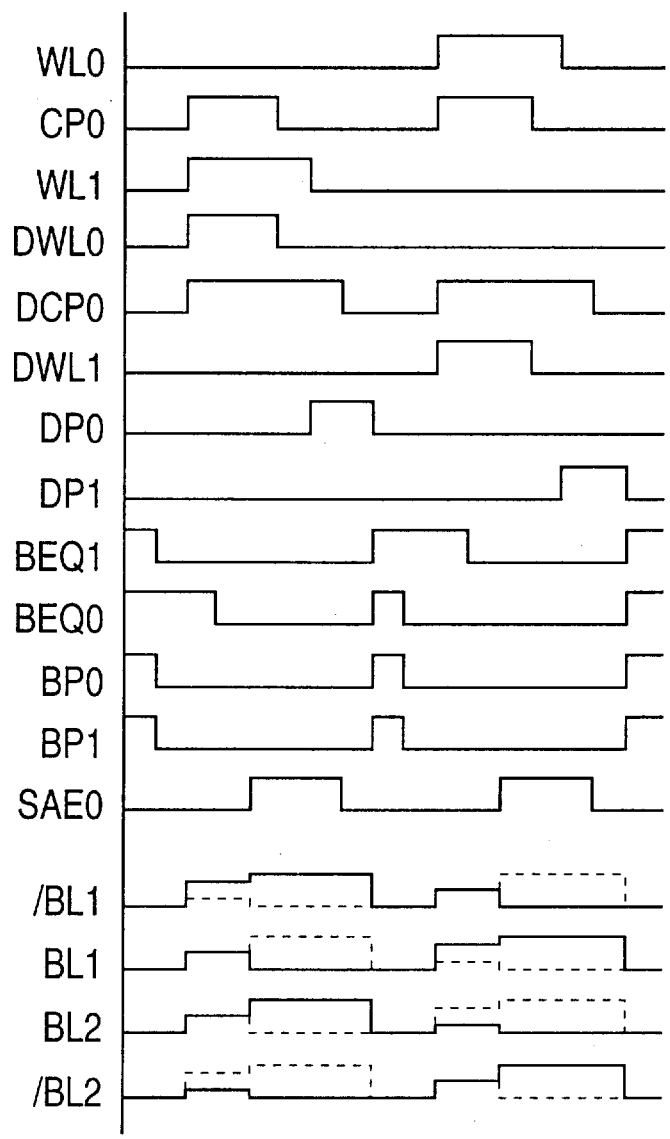
FIG. 7 shows an operational timing chart thereof.

Then, the operation of this semiconductor memory device is explained below by referring particularly the bit lines BL1, /BL1, BL2 and /BL2 shown in FIG. 7.

However, provided in this case are that data "1" is written in memory cell capacitor C11, data "0" is written in memory cell capacitor C12, data "1" is written in reference cell capacitor C01D, and data "0" is written in reference cell capacitor C02D.

At the initial state, word lines WL0 and WL1, cell plate electrode CP0, word lines DWL0 and DWL1 of reference cell, plate electrode DCP0 of reference cell, data precharge signals DP0 and DP1, and sense amplifier control signal SAE0 are at a logical potential of "L", while equalizing signals BEQ0 and BEQ1 and precharge signals BP0 and BP1 are set at a potential of "H".

Then, the MOS transistors Qn10, Qn11, Qn12, Qn13, Qn00D, Qn01D, Qn02D, and Qn03D are set at ON by changing the states of equalizing signal BEQ4 and precharge signals BP0 and BP1 into "L", and the states of cell plate electrode CP0, word line WL1, reference word line DWL0, and reference cell plate electrode DCP0 into "H".

Therefore, data "1" is read into bit line /BL1 from memory cell capacitor C11 and data "0" is read into bit line /BL2 from memory cell capacitor C12 respectively, and furthermore, data "1" is read into bit line BL1 from reference cell capacitor C01D and data "0" is read into bit line BL2 from reference cell capacitor C02D respectively.

On the other hand, since equalizing signal BEQ0 is set at "H", MOS transistor Qn1EQ is set at ON, and bit lines BL1 and BL2 are short circuited. By this, the potentials of bit lines BL1 and BL2 are averaged, yielding a reference potential.

In the next step, by setting equalizing signals BEQ0 at "L" and sense amplifier control signal SAE0 at "H", the operations of sense amplifiers SA0, SA1, SA2 and SA3 are commenced.

By this, the potential difference between the bit lines /BL1 and BL1 is amplified by sense amplifier SA1, and the potential difference between the bit lines BL2 and /BL2 is amplified by sense amplifier SA2.

By using the outputs of sense amplifiers supplied through respective bit lines, memory cell capacitors are rewritten. Furthermore, by using the equalizing signals BEQ0 and BEQ1 and the precharge signals BP0 and BP1 set at "H", the circuit can be returned into the initial condition.

Moreover, after setting word line WL1 at "L", the MOS transistors Qn00DP, Qn01DP, Qn02DP, and Qn03DP, are set at ON by setting precharge signal DP0 at "H", reference cell capacitors C00D and C02D are set at ground potential, and power supply potential Vcc is written in reference cell capacitors C01D and C03D.

By setting equalizing signal BEQ0 at "L" in next, the word line WL0, cell plate electrode CP0, reference word line DWL1, and the reference cell plate electrode DCP0 are set at "H" respectively, and by this, the data in memory cell capacitors C01 and C02 are read out. After this, data rewriting is performed by taking the above described operations.

In this embodiment of the invention, the generation of reference potential is performed by utilizing either one of the adjoined bit line pairs instead of a unit of paired bit line. Thus, deviations of bit line load capacitances can be avoided, and reference potentials of higher accuracy can be obtained.

Moreover, errors possible at data readout and rewriting can be avoided, and since a precharging process by which the bit lines are set once at ground potential before the generation of reference potential and data readout, can be omitted, a shorter access time can be realized.

Embodiment-6

Figure 8:
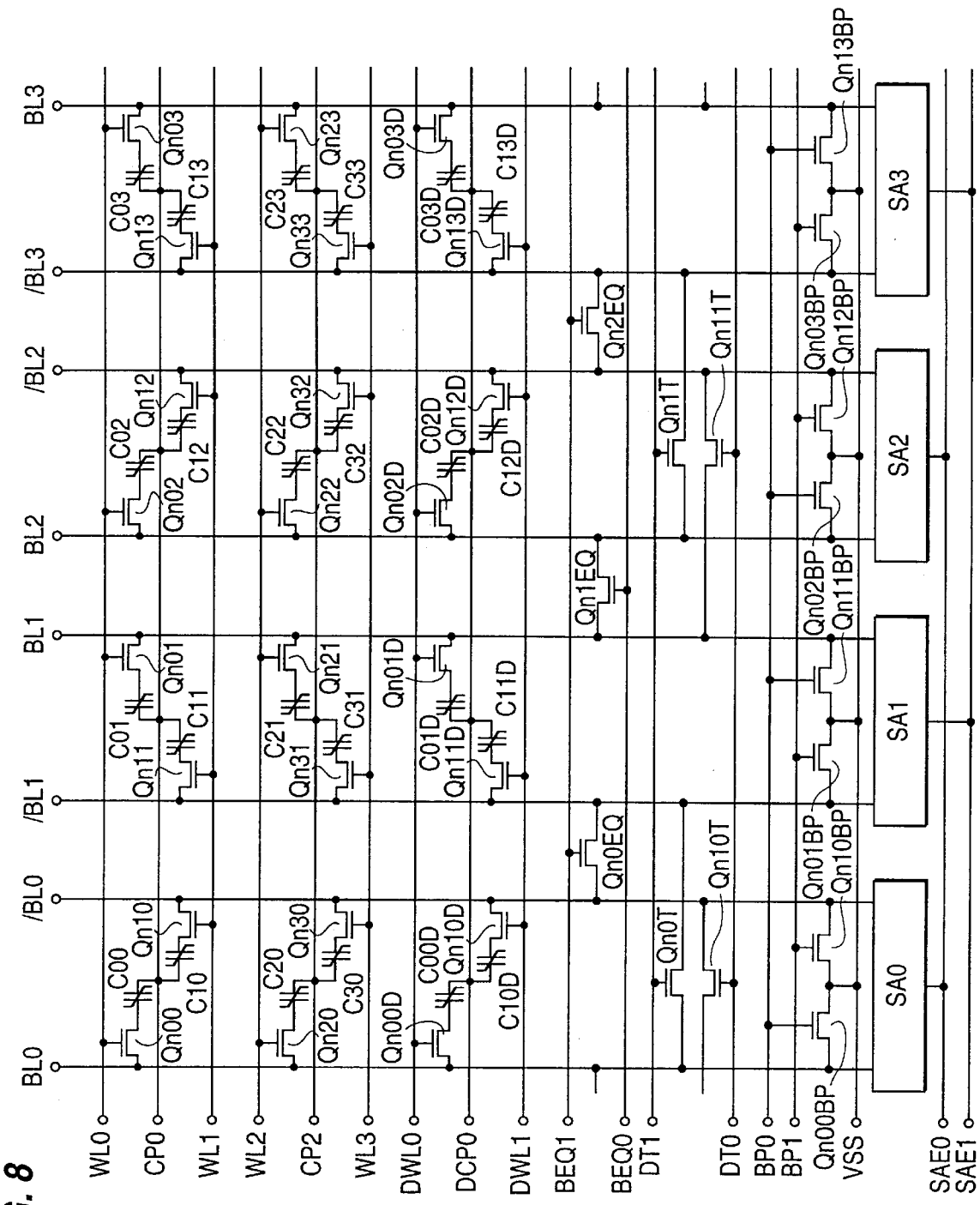
FIG. 8 shows a circuit construction of semiconductor memory device which is a sixth embodiment of the invention.

The sixth embodiment of the invention shown in FIG. 8 is a modification of Embodiment-5. This is different from Embodiment-5 in respect that MOS transistor Qn0T connecting bit line BL0 and bit line /BL1, MOS transistor Qn11T connecting bit line BL1 and bit line /BL2, and MOS transistor Qn1T connecting bit line BL2 and bit line /BL3 are disposed, and that sense amplifier SA0 and sense amplifier SA2 are commonly controlled by control signal SAE0, and sense amplifier SA1 and sense amplifier SA3 are commonly controlled by control signal SAE1 respectively.

However, since the MOS transistors Qn00DP–Qn03DP and Qn10DP–Qn13DP required for the data writing to reference cells and the control signals DP0 and DP1 for these shown in FIG. 6 are not needed anymore in Embodiment-6, these are omitted here.

Figure 9:
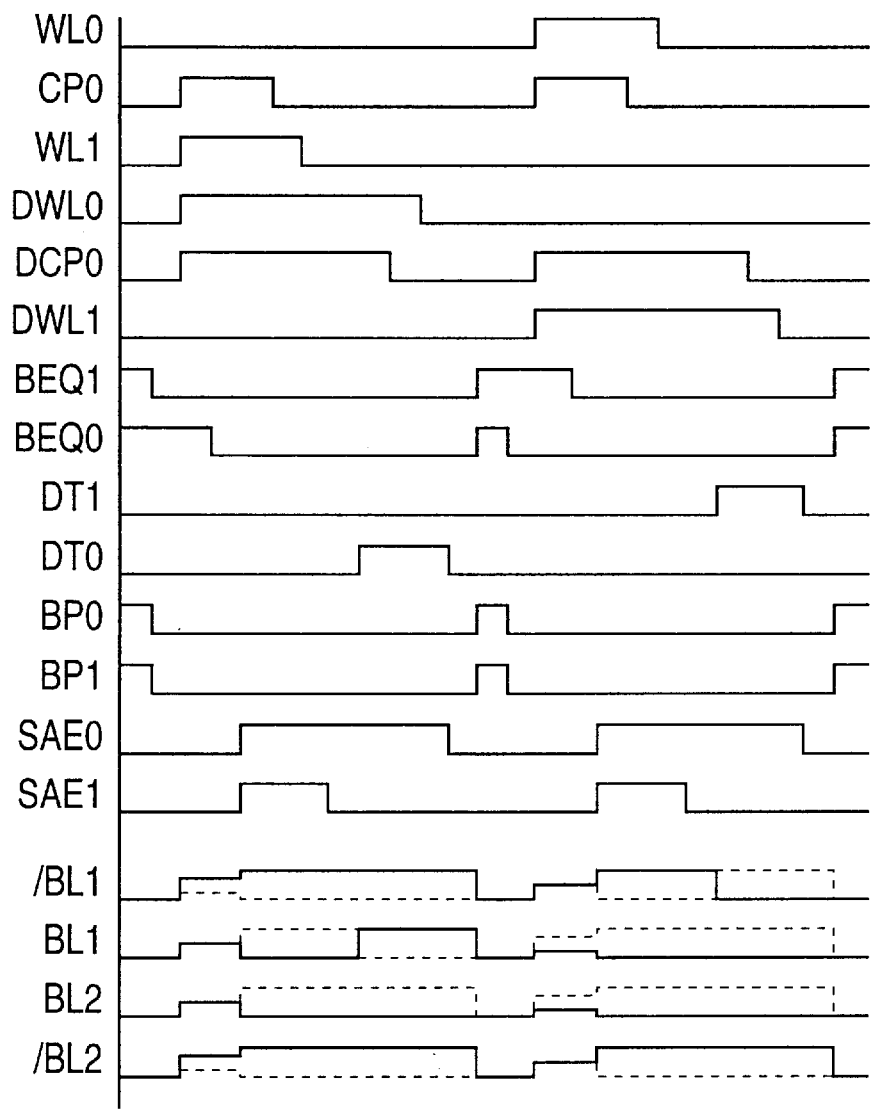
FIG. 9 shows an operational timing chart thereof.

The operations of this semiconductor memory device are now explained below by referring FIG. 9. Same as the case of Embodiment 5, the operations are began with an operation setting the word lines WL1 and DWL0 and cell plate electrodes CP0 and DCP0 at "H" holding a condition of the equalizing signal BEQ0 which is set at "H", and setting the related MOS transistors at ON.

Then, a reference potential is generated between the bit lines BL1 and BL2, and data in the memory cell are read out in bit lines /BL1 and /BL2, and the difference between said reference potential and the data is amplified by the sense amplifier in the succeeding operation.

The control signal SAE1 is then set at "L", and the signal DT0 is set at "H" next. At this condition, sense amplifiers SA0 and SA2 are set in operating conditions, while sense amplifiers SA1 and SA3 are set in non operating conditions, and MOS transistor Qn11T is set in a state of ON. Therefore, a data same as the one given to bit line /BL2 is given to bit line BL1, and a data same as the one given to bit line /BL3 is given to bit line BL2. The same data are written in the reference capacitors C01D and C02D also.

The states of equalizing signal BEQ0 and BEQ1, and precharge signals BP0 and BP1 are changed into "H" next in order to restore the initial condition.

By setting the word line WL0 and cell plate electrode CP0 at "H" in next, data in memory cell capacitors C01 and C02 are read out from bit lines BL1 and BL2, and by setting signal DT1 at "H", data are written in the reference cells like the case shown above.

In this embodiment of the invention, the rewriting in the reference cell capacitors is performed by utilizing a data same as the one used for one of the bit lines constituting a paired bit line. Therefore, no potential difference is produced between the corresponding reference cell capacitors, and as a result of this, a reference potential of higher accuracy can be obtained, and errors possible at data readout and rewriting can be eliminated. Moreover, since no data rewriting circuit for the reference cell capacitor has to be provided, the circuit can be simplified substantially.

Embodiment-7

Figure 10:
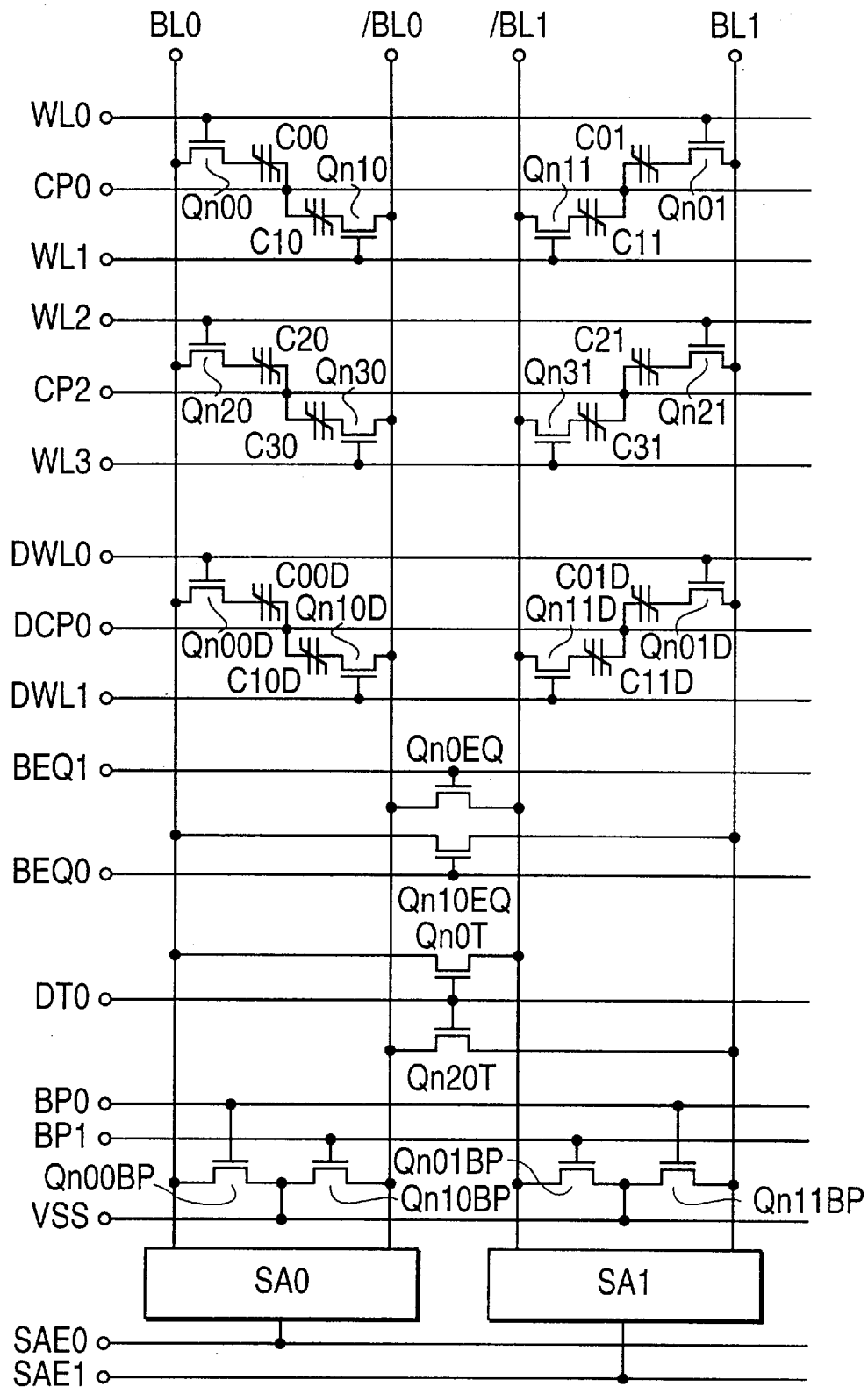
FIG. 10 shows a circuit construction of semiconductor memory device which is a seventh embodiment of the invention.

The seventh embodiment of the invention shown in FIG. 10 is a modification of semiconductor memory device shown in Embodiment-5. This is different from Embodiment-5 in respect that MOS transistor Qn10EQ connecting bit line BL0 and bit line BL1, MOS transistor Qn0T connecting bit line /BL0 and bit line /BL1, and MOS transistor Qn20T connecting bit line /BL0 and bit line BL1 are disposed, and that sense amplifier SA0 is controlled by control signal SAE0 and sense amplifier SA1 are controlled by control signal SAE1 respectively.

Moreover, since the MOS transistors Qn00DP–Qn03DP and Qn10DP–Qn13DP required for the data writing to reference cells and the control signals DP0 and DP1 required for these shown in FIG. 6 are not needed in Embodiment-7, these can be omitted here.

In another words, the fundamental difference of Embodiment-7 from Embodiment-5 is that this is constituted of a first reference potential generating means consisted of bit lines /BL0 and /BL1 and MOS transistor Qn0EQ, and a second reference potential generating means consisted of bit lines BL0 and BL1 and MOS transistor Qn10EQ.

Figure 11:
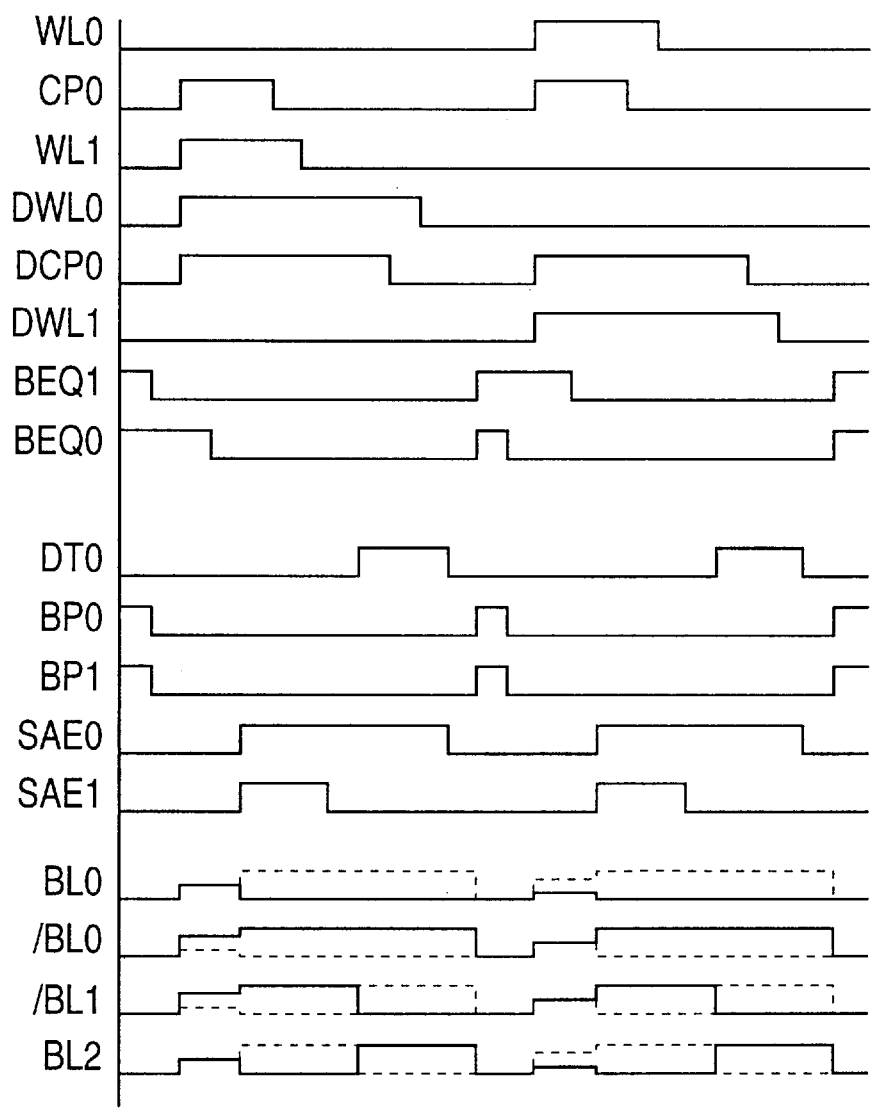
FIG. 11 shows an operational timing chart thereof.

The operations of this semiconductor memory device are now explained below by referring FIG. 11. Same as the case of Embodiment-5, the operations are started with an operation setting word lines WL1 and DWL0 and cell plate electrodes CP0 and DCP0 at "H" holding a condition of the equalizing signal BEQ0 set at "H", and setting the related MOS transistors at ON.

While a reference potential is generated between the bit lines BL0 and BL1, data in the memory cell are then read out in bit lines /BL0 and /BL1, and the differences between said reference potential and the data potential are amplified by sense amplifiers SA0 and SA1 in next. The procedures up to this point are identical with those shown in Embodiment-5.

Then, control signal SAE1 is set at a logical potential of "L", and the signal DT0 is set at "H" next. At this condition, sense amplifier SA0 is set at an operating condition and sense amplifier SA1 is set at a non operating condition, and MOS transistors Qn0T and Qn20T are set in a state of ON. Therefore, a data same as the one given to bit line BL0 is given to bit line /BL1, and a data same as the one given to bit line /BL0 is given to bit line BL1 also. Then, data are written in reference capacitors C00D and C01D.

In Embodiment-7, since the rewriting into the adjoining bit line pair is performed by using a common sense amplifier, no potential difference is produced between the corresponding reference cell capacitors. As a result of this, a reference potential of higher accuracy can be obtained, and errors possible at data readout and rewriting can be eliminated. Moreover, since the data transferring circuits operated between bit lines are not required in this case, the circuit can be simplified substantially.

Embodiment-8

Figure 12:
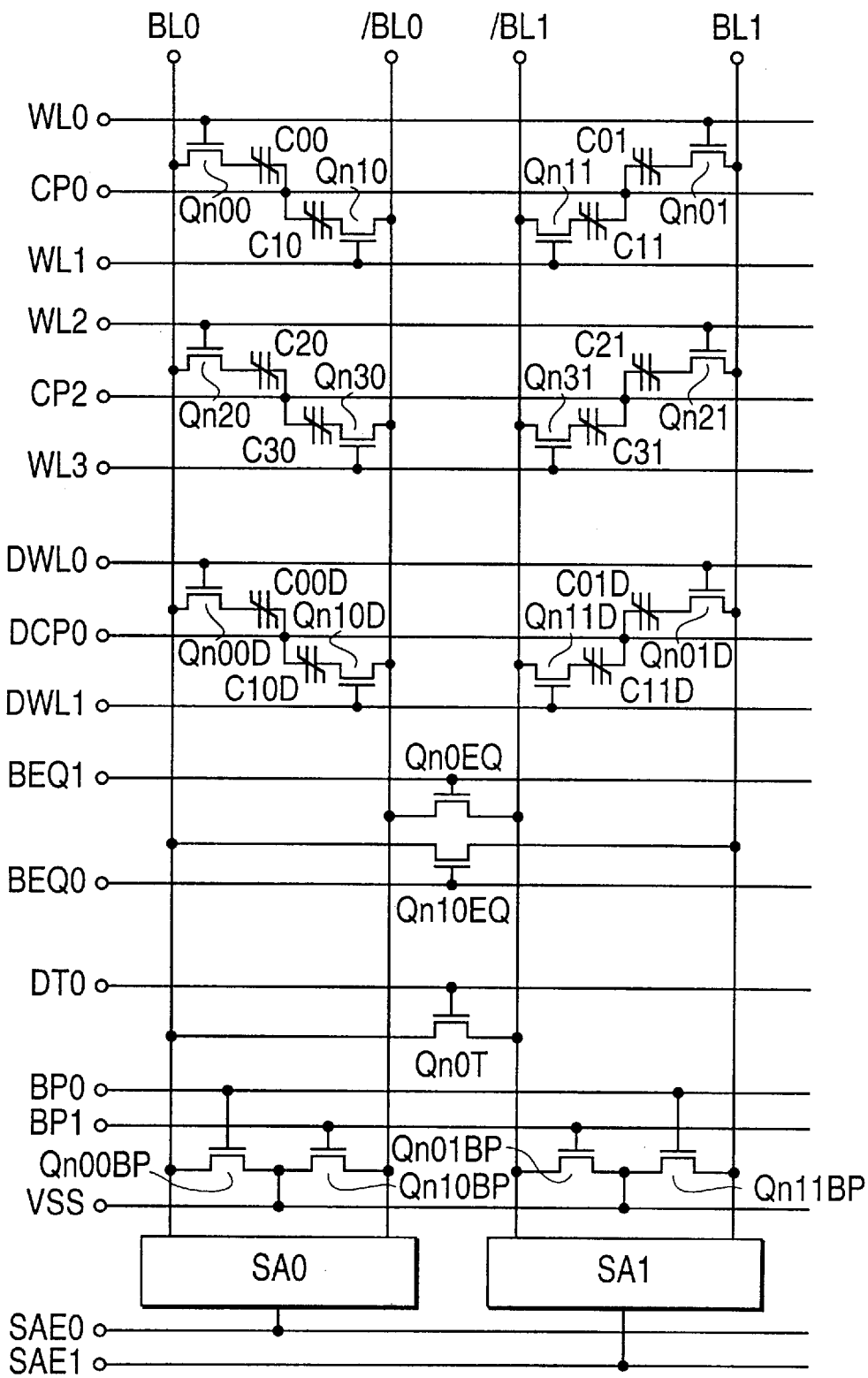
FIG. 12 shows a circuit construction of semiconductor memory device which is an eighth embodiment of the invention.

The eighth embodiment of the invention shown in FIG. 12 is a modification of Embodiment-7. This is different from Embodiment 7 only in respect that MOS transistor Qn20T shown in FIG. 10 is omitted.

Figure 13:
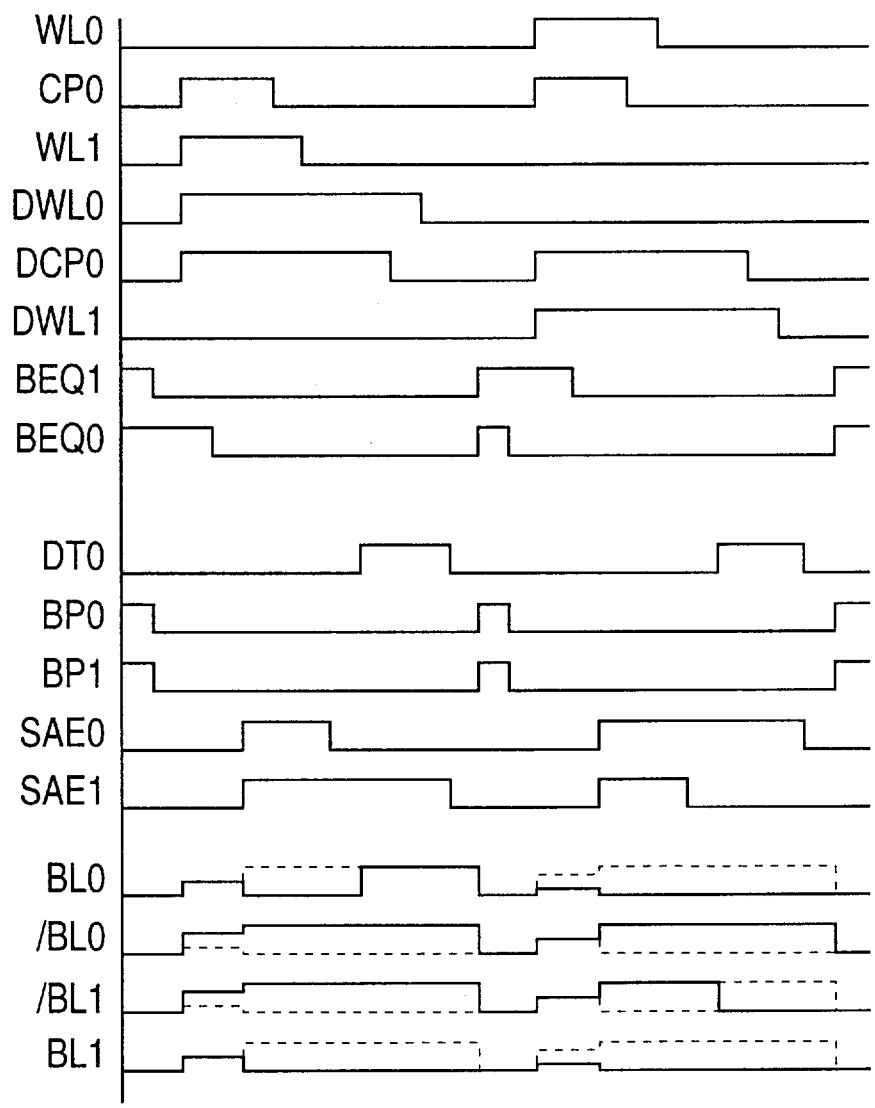
FIG. 13 shows an operational timing chart thereof.

The operations of this semiconductor memory device are now explained below by referring FIG. 13. Same as the case of Embodiment 7, the operations are started with an operation setting the word lines WL1 and DWL0 and the cell plate electrodes CP0 and DCP0 at "H", and while a reference potential is generated between the bit lines BL0 and BL1, data in the memory cell are read out in bit lines /BL0 and /BL1. The differences between said reference potential and the data are amplified by sense amplifiers SA0 and SA1 in the succeeding operation. The operation procedures up to this point are identical with those shown in Embodiment-7.

Control signal SAE0 is then set at "L", and signal DT0 is set at "H" next. At this condition, sense amplifier SA0 is set at a non operating condition and sense amplifier SA1 is set in an operating condition, and MOS transistor Qn0T is set at ON. Therefore, since the data same as the one given to bit line /BL1 is given to bit line BL0, the data are written in the reference capacitor C00D also.

Thus, the device is returned to the initial condition by setting equalizing signals BEQ0 and BEQ1 and precharge signals BP0 and BP1 at "H".

Word line WL0 and cell plate electrode CP0 are then at "H" in order to read the data in the memory cells of bit lines BL0 and BL1. Likewise, data is written in the reference cell by setting signal DT0 at "H". At this time, since sense amplifier SAE0 is at an operating condition while sense amplifier SAE1 is at a non operating condition, the data same as the one given to bit line BL0 is given to bit line /BL1, and the data is also written in reference cell capacitor C11D.

In this embodiment of the invention, like the case of Embodiment-7, the rewriting into the adjoining bit line pair is performed by a common sense amplifier. Therefore, no potential difference between the corresponding reference cell capacitors is produced.

As a result of this, a reference potential of higher accuracy can be obtained, and errors possible at data readout and rewriting can be eliminated. Moreover, since the data transferring circuits operated between the bit lines are not required in this case, the circuit can be simplified substantially.

Embodiment-9

Figure 14:
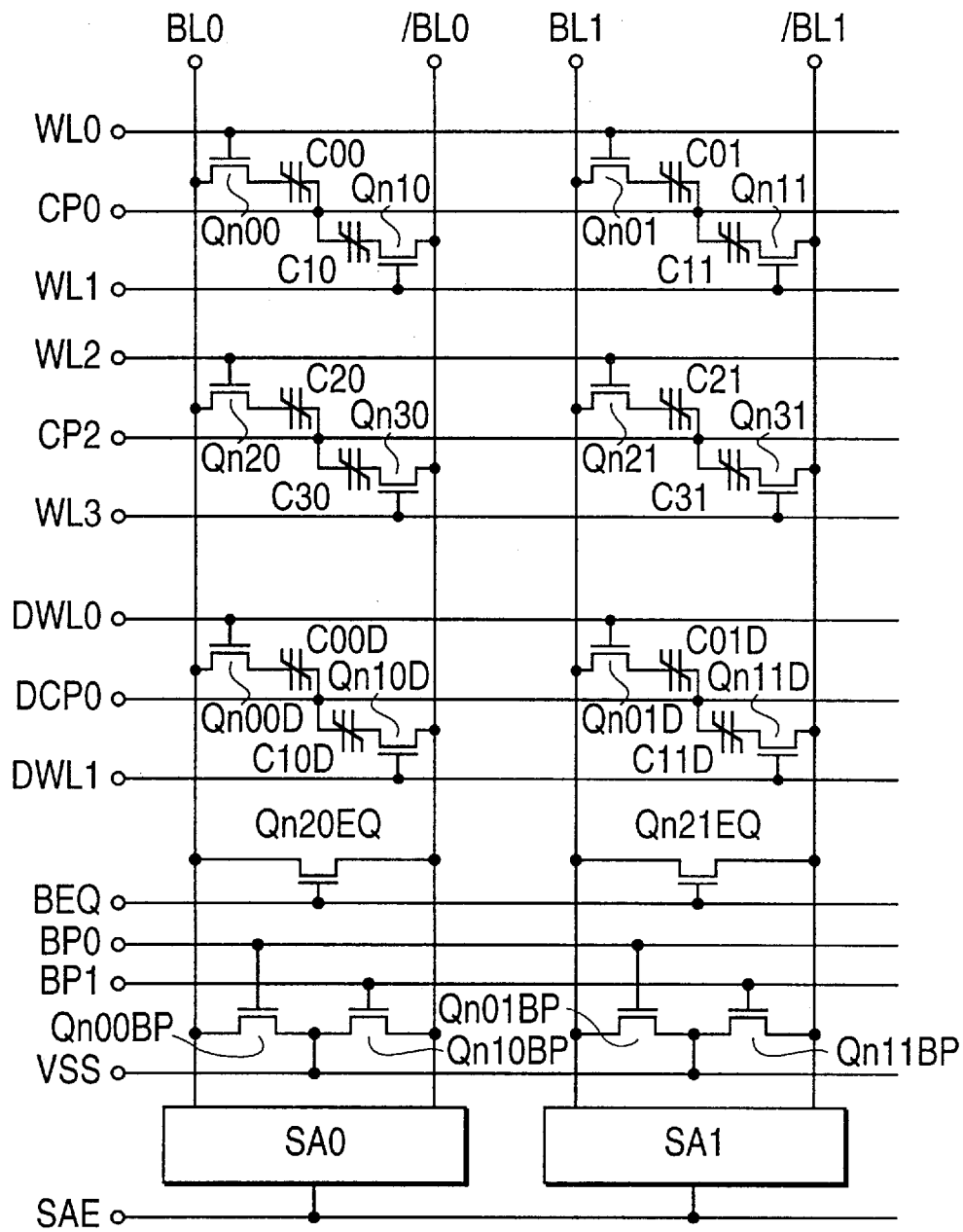
FIG. 14 shows a circuit construction of semiconductor memory device which is a ninth embodiment of the invention.

The ninth embodiment of the invention shown in FIG. 14 is developed from the fundamental circuit of Embodiment-2.

In Embodiment-9, bit lines 31 and 33, and bit lines 32 and 34 shown in FIG. 2 are made in common respectively.

Embodiment-9 is a further simplified version of Embodiment-8, and is different from Embodiment-8 only in respect of that MOS transistor Qn20EQ (Qn21EQ) is disposed between the bit lines BL0 and /BL0 (BL1 and /BL1) in order to generate a reference potential between the bit lines BL0 and /BL0 (BL1 and /BL1).

Figure 15:
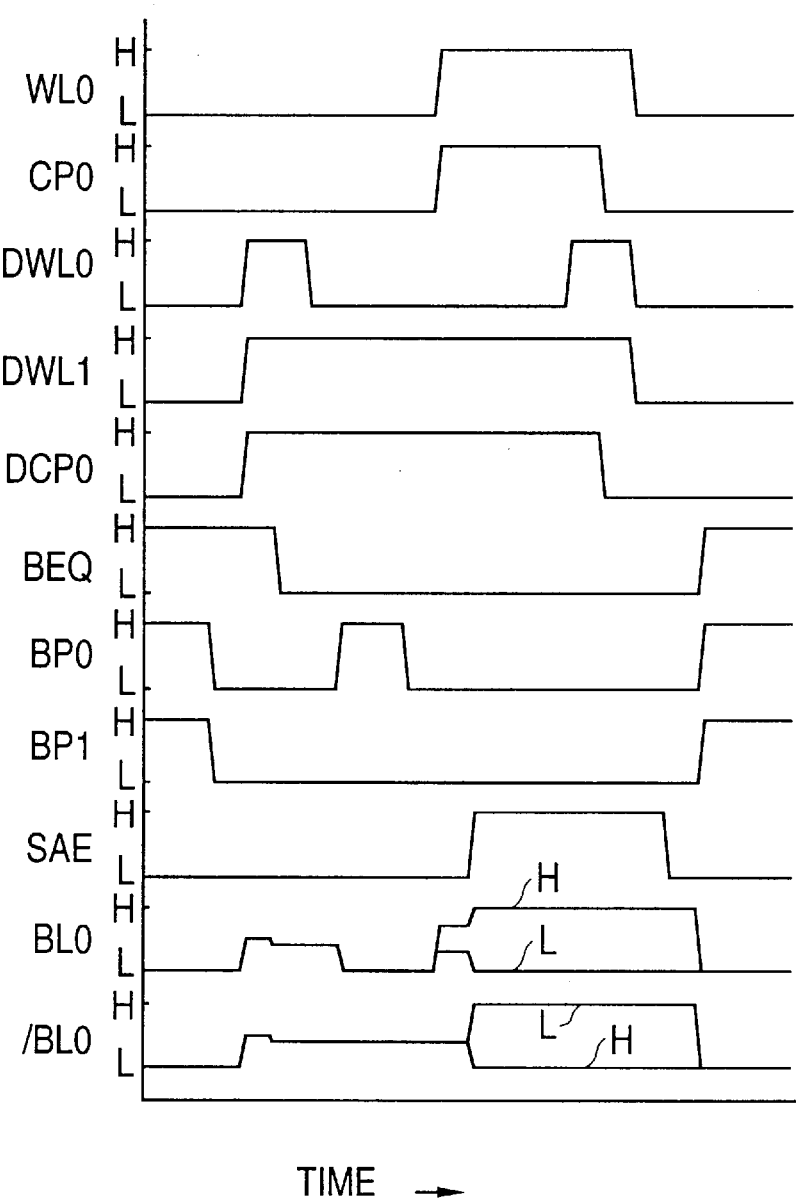
FIG. 15 shows an operational timing chart thereof.

The operations of this semiconductor memory device are now explained by referring FIG. 15 in respect to bit lines BL0 and /BL0.

In order to read out the data stored in the memory cell consisted of MOS transistor Qn00 and memory cell capacitor C00, the word line WL0, cell plate electrode CP0, word lines DWL0 and DWL1, cell plate electrode DCP0, and the sense amplifier control signal SAE are initially set at "L" respectively, and equalizing signal BEQ and precharge signals BP0 and BP1 are set at "H".

Since the states of MOS transistors Qn20EQ, Qn00BP, and Qn10BP are set at ON this time, no potential difference between the bit lines BL0 and /BL0 is produced. Moreover, bit lines BL0 and /BL0 are set at ground potential Vss or at "L".

Then, precharge signals BP0 and BP1 are set at "L". In this, the states of MOS transistors Qn00BP and Qn10BP are set at OFF, and bit lines BL0 and /BL0 are set at a floating condition. However, the MOS transistor Qn20EQ is set at a state of ON.

The word lines DWL0 and DWL1 and cell plate electrode CP0 are set at "H" in next, and by this, the states of MOS transistors Qn00D and Qn10D are set ON, and the charge stored in reference cell capacitors C00D and C10D flows into bit lines BL0 and /BL0. However, since the state of MOS transistor Qn20EQ is kept at ON, the charge transfer between bit lines is continued up to the point of the charge equalization or until the charges are averaged. If data "H" is written in reference cell capacitor C00D and if data "L" is written in reference cell capacitor C10D respectively, the bit line capacitances would become nearly equal.

Thus, the bit line capacitance which is charged when the MOS transistor Qn20EQ is set at ON would be doubled over a case of single bit line. Therefore, the reference potential in this case equals nearly to a sum of the charge read out at "H" and the charge read out at "L", divided by the bit line capacitance.

Then, equalizing signal BEQ is set at "L" and MOS transitor Qn20EQ is set at OFF in next. And then, reference word line DWL0 is set at "L", and precharge signal BP0 is set at "H". By this, MOS transistor Qn00BP is set at ON and bit line BL0 is set at ground potential Vss or "L". After setting bit line BL0 at "L", precharge signal BP0 is set at "L". At this time, the reference potential is held in the bit line /BL0.

At this condition, word line WL0 and cell plate electrode CP0 are set at "H", and by this, MOS transistor Qn00 is set at ON, and the data stored in memory cell capacitor C00 is read out in bit line BL0.

Then, sense amplifier control signal SAE is set at "H" in order to activate the sense amplifier. When "1" is written in memory cell capacitor C00 in advance, a potential difference between the potential corresponding to data "1" obtained from bit line BL0 and the reference potential from bit line /BL0 is inputted into sense amplifier SA0, and this potensial difference is amplified and data "1" is outputted.

In next, word line DWL0 is set at "H" in order to set MOS transistor Qn00D at ON, and furthermore, cell plate electrodes CP0 and DCP0 are set at "L". Thus, "1" is rewritten in memory cell capacitor C00 and reference cell capacitor C00D respectively. After word line DWL0 and reference word lines DWL0 and DWL1 are set at "L", sense amplifier control signal SAE is then set at "L" and equalizing signal BEQ and precharge signals BP0 and BP1 are set at "H" in order to return the operation to the initial condition.

Moreover, even when data "0" is written in memory cell capacitor C00 in advance, data "0" is read out through the above described procedures, and the necessary data rewriting is performed returning the state to the initial condition.

In this embodiment of the invention, the memory cell of semiconductor memory device is constituted of transistors, capacitors, and reference cells having a construction same as that of said memory cell. The reference potential generated in this case equals to an average of potentials derived from the data stored in reference cell capacitors C00D and C10D. Therefore, a precisely controlled reference potential can be supplied always eliminating the possibilities of errors at data readouts and rewriting.

Embodiment-10

Figure 16:
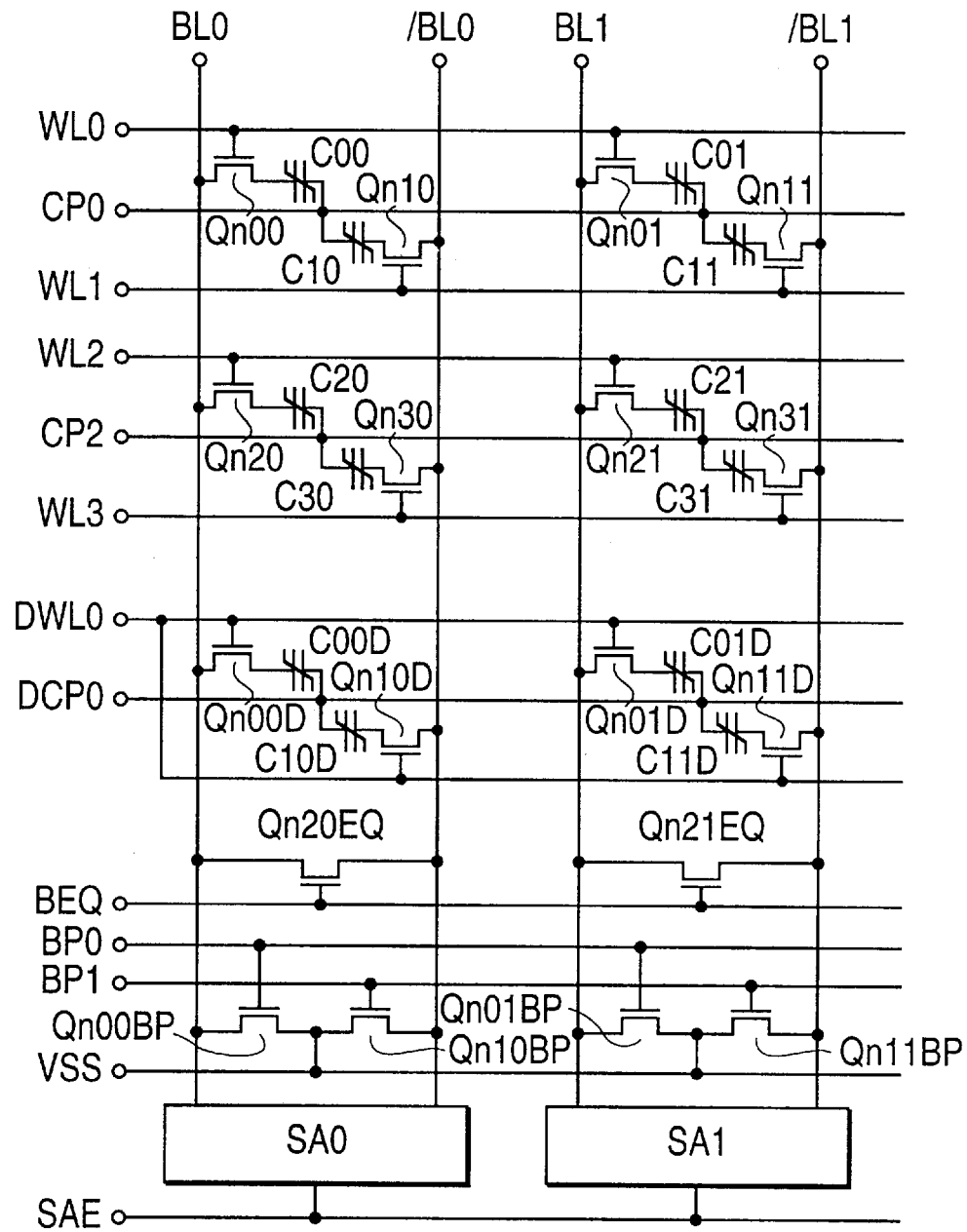
FIG. 16 shows a circuit construction of semiconductor memory device which is a tenth embodiment of the invention.

The tenth embodiment of the invention shown in FIG. 16 is a modification of Embodiment-9 which is different from Embodiment 10 in respect that the gates of MOS transistors Qn00D and Qn10D constituting the reference cells are connected in common and are controlled by a same signal. In Embodiment-10, the load capacitances between the bit lines at data readouts are equalized in order to eliminate the potential deviation caused by the imbalance of load capacitances.

Figure 17:
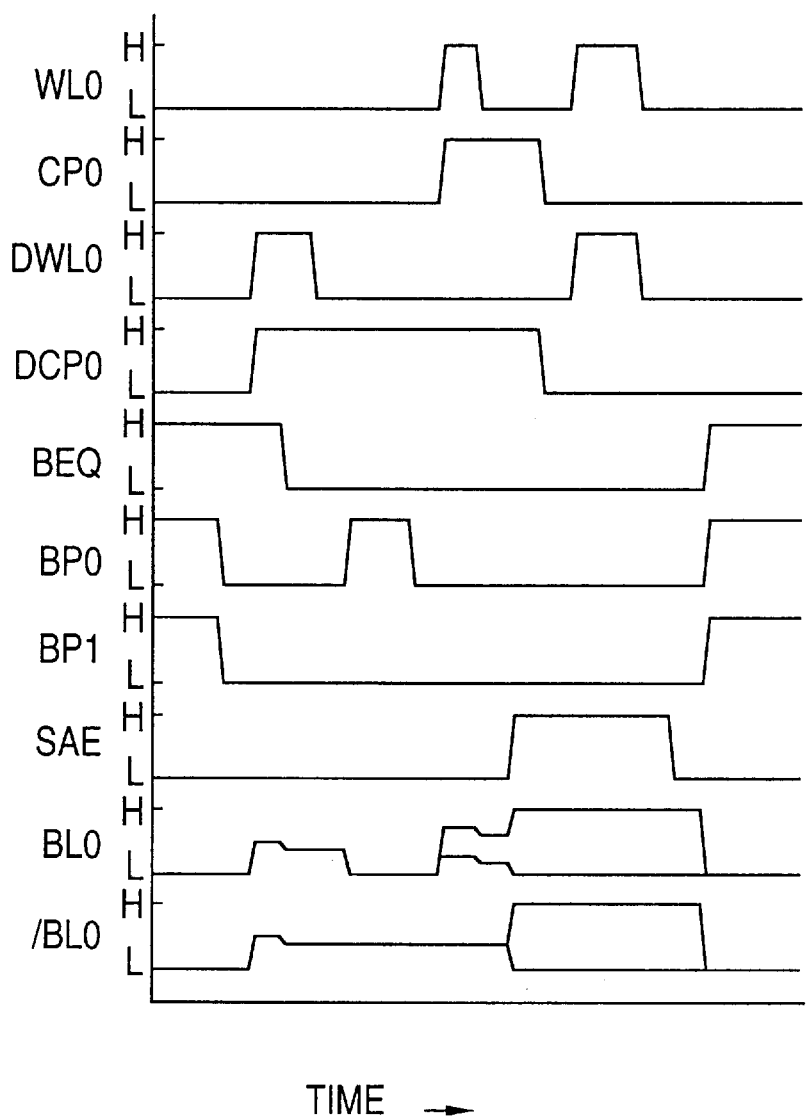
FIG. 17 shows an operational timing chart thereof.

The operation of Embodiment-10 is now explained by referring FIG. 17 in respect to its bit line BL0 and /BL0.

Similar to the case of Embodiment-9, when equalizing signal BEQ is set at "H" and MOS transistor Qn20EQ is set at ON, data are read out in bit line BL0 from reference cell capacitor C00D and in bit line /BL0 from reference cell capacitor C10D respectively, and the obtained potentials are averaged to yield a reference potential. Then, word line DWL0 of reference cell is set at "L", and MOS transistors Qn00D and Qn10D are set at OFF, and reference cell capacitors C00D and C10D are disconnected from bit lines BL0 and /BL0.

At this time, when MOS transistor Qn20EQ is disconnected from bit lines BL0 and /BL0 by setting the equalizing signal BEQ at "L", the load capacitances of bit lines BL0 and /BL0 are deviated, and the reference potential is lowered by a potential corresponding to said deviation. However, this lowered potential can be compensated by taking the later explained operations.

Precharge signal BP0 is then set at "H" and only bit line BL0 is set at ground potential Vss. At this time, the potential of bit line /BL0 is a reference potential. By setting word line WL0 and cell plate electrode CP0 at "H" respectively, the data in memory cell capacitor C00 is read into bit line BL0. After this, word line WL0 is set at "L" in order disconnect Qn00 is from bit line BL0.

By this, the load capacitance of bit line BL0 is changed, and the potential of bit line BL0 is lowered by a potential corresponding to that potential change. Since this potential decrease corresponds to the decrease of reference potential, the above means an accomplishment of the potential decrease compensation.

Then, by disconnecting all of the MOS transistors from both bit lines, control signal SAE is set at "H", and data obtained from both bit lines are amplified by the sense amplifiers. And at rewriting, word lines WL0 and DWL0 are set at "H" again and the data are written. Then, the device is returned to its initial condition.

As above described, the decrease of reference potential caused by the disconnection of MOS transistor Qn20EQ from bit line BL0 is compensated by the potential decrease caused by the disconnection of MOS transistor Qn00 from bit line after the data are readout from the memory cells. Moreover, in amplifying the potential difference between the bit lines BL0 and /BL0 by using sense amplifier SA0, only the bit line capacitances are considered as the capacitance of both bit lines. Thus, data readout and rewriting can be accomplished at higher accuracy.

Furthermore, the compensation of potential decrease can also be accomplished in Embodiment-9 shown in FIG. 14. That is, in amplifying the potential difference between the bit line BL0 and the bit line /BL0 by using sence amplifier SA0, the load capacitances of bit lines can be equalized by setting word lines WL0 and DWL0 at "H" and MOS transistors Qn00 and Qn10D at ON. Since the potential decreases of both bit lines can be equlized by this, data readout and rewritng of higher accuracy can be accomplished.

In addition to this, as shown in the operational timing chart in FIG. 15, data is read out from memory cell capacitor C00 by settinng MOS transistor Qn00 at ON at a condition where MOS transistor Qn10D is set at ON in Embodiment-9. Therefore, this means an addition of capacitance of MOS transistor Qn00 to bit line BL0 and an addition of capacitance of MOS transistor Qn10D to bit line /BL0 respectively, and this means also an equalization of load capacitances of bit lines.

Embodiment-11

Figure 18:
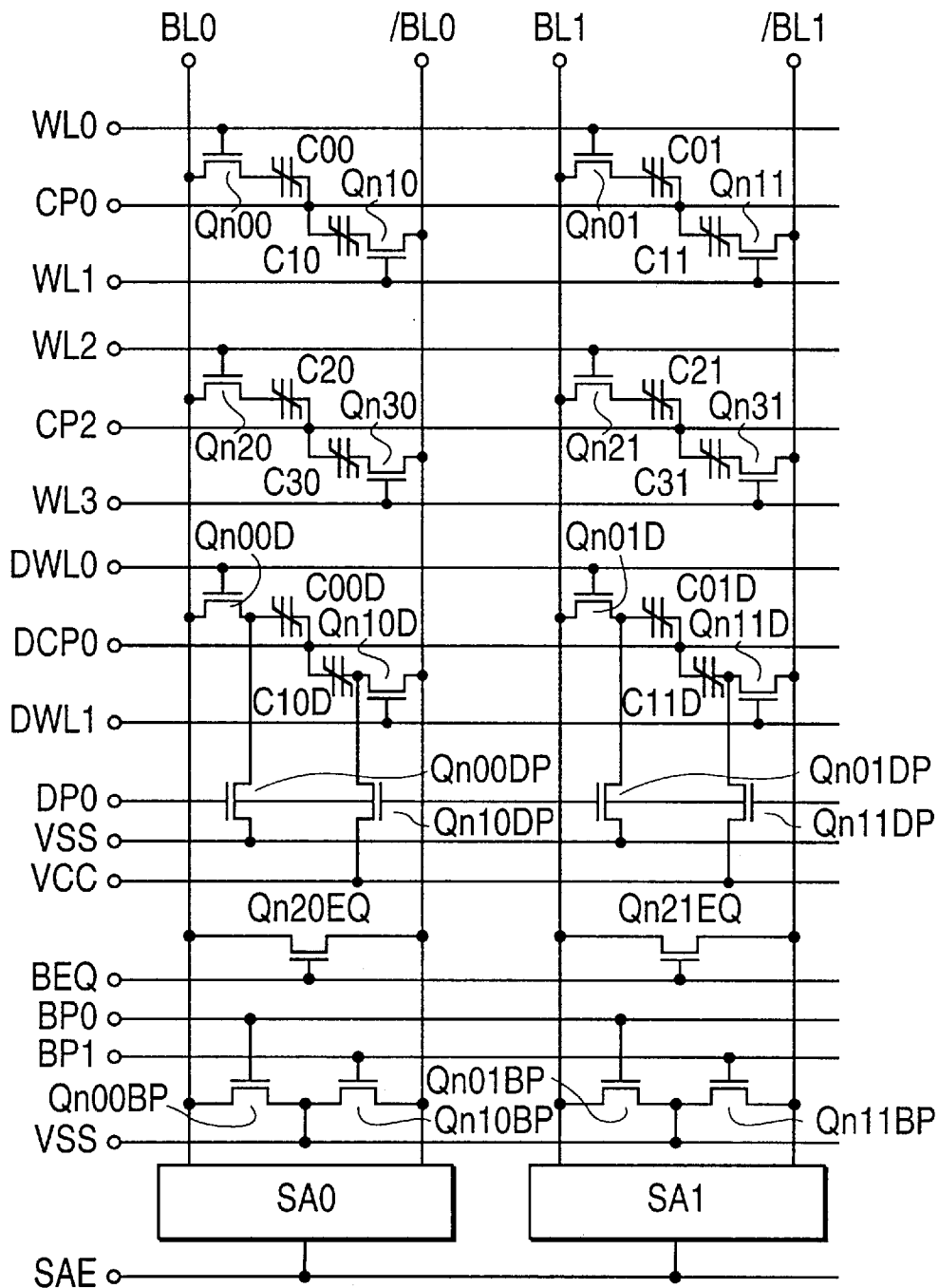
FIG. 18 shows a circuit construction of semiconductor memory device which is an eleventh embodiment of the invention.

The semiconductor memory device shown in FIG. 18, i.e., Embodiment 11, is another modification of Embodiment-9. The difference from Embodiment-9 is that the source of MOS transistor Qn00D and ground potential Vss are connected through MOS transistor Qn00DP, the source of MOS transistor Qn10D and power supply potential Vcc are connected through MOS transistor Qn10DP, and MOS transistors Qn00DP and Qn10DP are commonly controlled by precharge signal DP0. The present embodiment of the invention relates to data writing to the reference cell while data writing to the reference cell is performed by bit lines in Embodiment-9.

Figure 19:
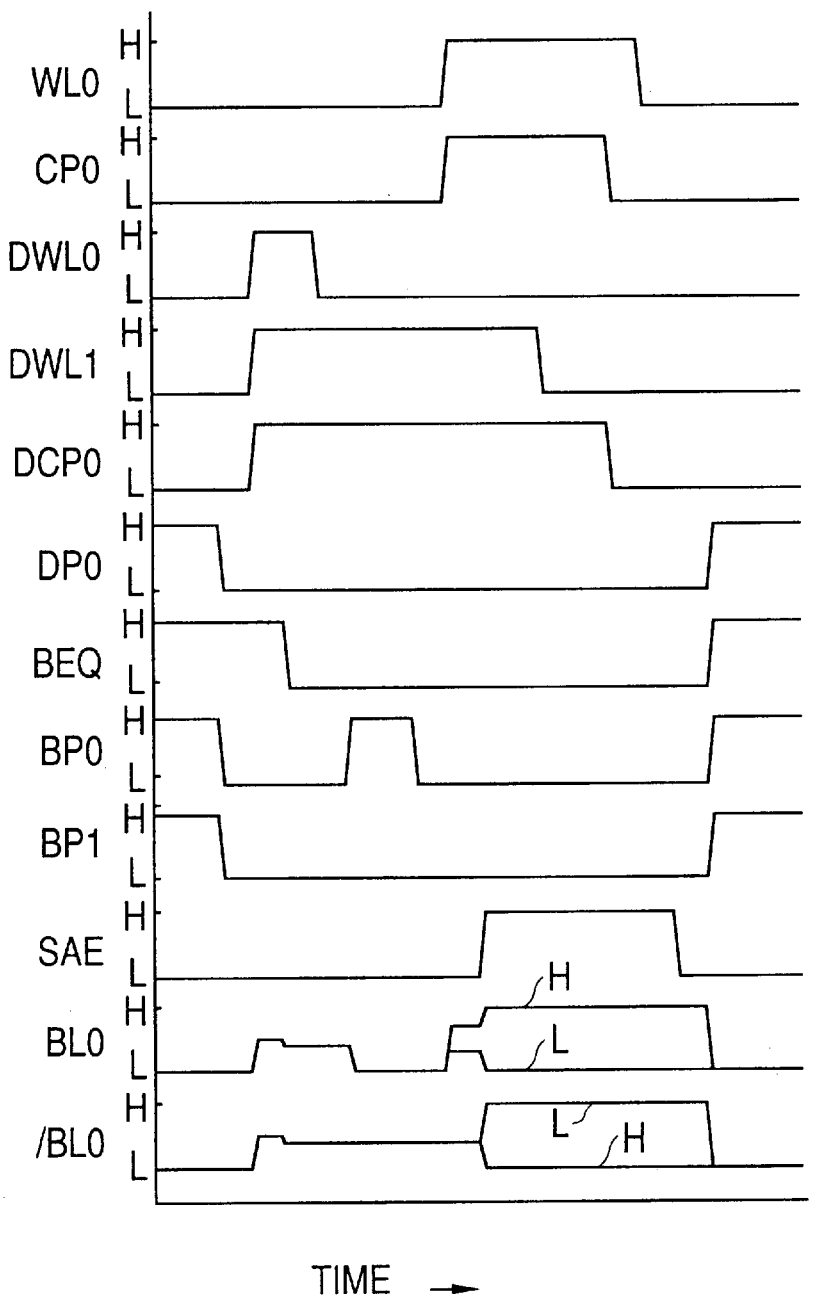
FIG. 19 shows an operational timing chart thereof.

The operation of Embodiment-11 is now explained below by referring FIG. 19.

Starting from the initial condition, MOS transistors Qn00DP and Qn10DP are set at ON by setting precharge signal DP0 at a logical potential of "H". By this, the potential of reference cell capacitor C00D is set at ground potential Vss, and the potential of reference cell C10D is set at power supply potential Vcc.

Then, like case of Embodiment-9, data in the reference cell is read out into bit lines BL0 and /BL0, and the potentials of these are averaged to obtain a reference potential. After setting bit line BL0 to ground potential Vss, data stored in memory cell capacitor C00 is read out into bit line BL0, and is amplified by sense amplifier SA0. Then, by performing data rewriting to the memory cell capcitor and reference cell capacitor, the operation is completed. The operational timing completing this series of operations show here is identical with the operational timing of Embodiment-9.

As described in above, in Embodiment-11, any potential can be written in the reference cell capacitor through an external circuit. Since any desired potential can be written in the reference cell before its operation, stable data readout and writing operations can be obtained.

Furthermore, although ground potential Vss or power supply potential Vcc is used as the writing potential to the reference cell throughout the above shown explanations, this needs not be limited within said potentials, but any writing potential can be employed as well.

Embodiment-12

Figure 20:
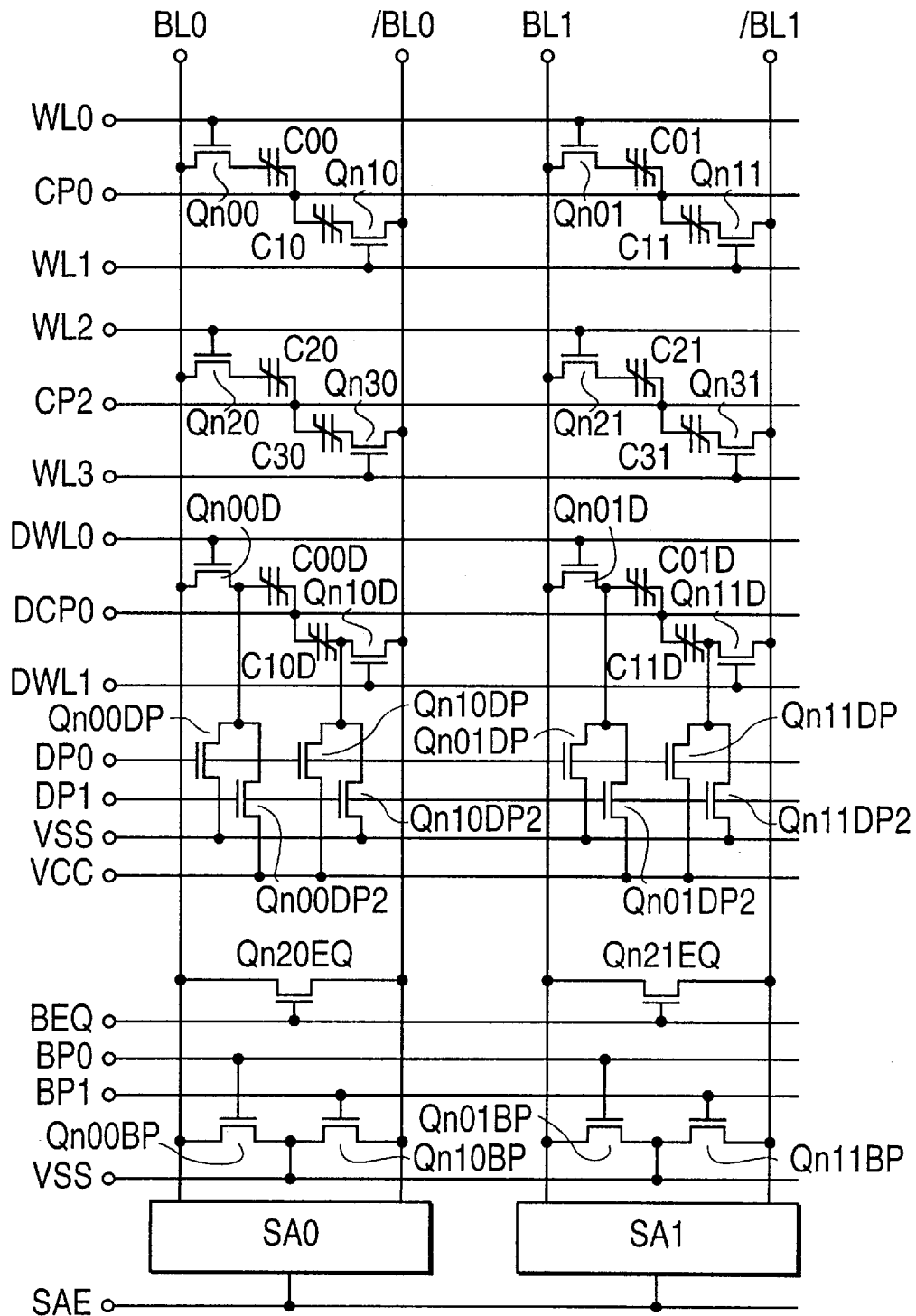
FIG. 20 shows a circuit construction of semiconductor memory device which is a twelfth embodiment of the invention.

The semiconductor memory device shown in FIG. 20, i.e., Embodiment-12, is still another modification of Embodiment-9. Similar to Embodiment-11, this embodiment relates to a data writing to reference cell.

The difference of Embodiment-12 from Embodiment-9 is that the source of MOS transistor Qn00D and ground potential Vss are connected through MOS transistor Qn00DP, and the source of MOS transistor Qn00D and power supply potential Vcc are connected through MOS transistor Qn00DP2, and that the source of MOS transistor Qn10D and power supply potential Vcc are connected through MOS transistor Qn10D and ground potential Vss are connected through MOS transistor Qn10DP2.

The MOS transistors Qn00DP and Qn10DP are connected to be controlled by precharge signal DP0, and likewise, the MOS transistors Qn00DP2 and Qn10DP2 are connected and controlled by same precharge signal DP1 respectively.

Figure 21:
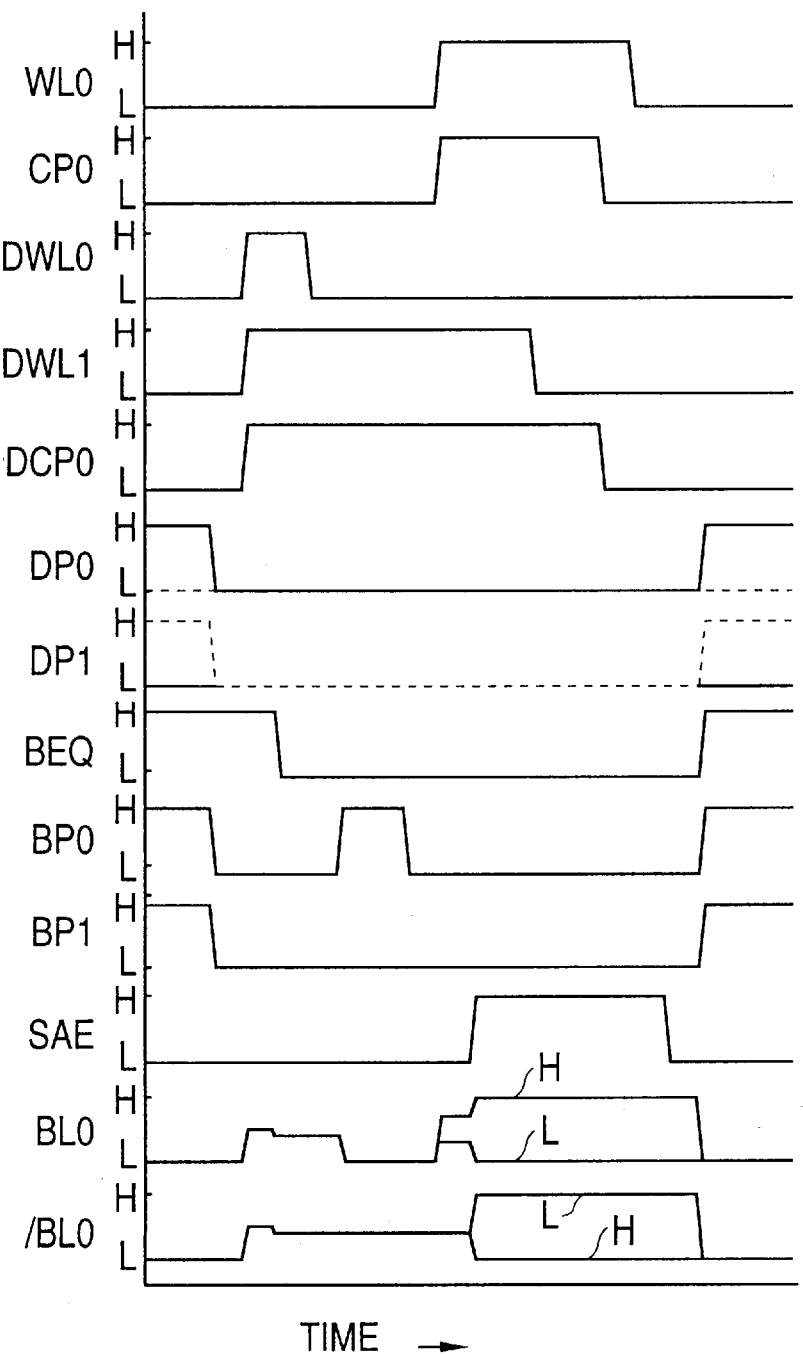
FIG. 21 shows an operational timing chart thereof.

The operation of Embodiment-12 is now explained below by referring FIG. 21.

First, at the initial condition, the MOS transistors Qn00DP and Qn10DP are set at ON by setting precharge signal DP0 at a logical potential of "H". By this, the potential of reference cell capacitor C00D is set at ground potential Vss, and the potential of reference cell C10D is set at power supply potential Vcc. Similar to Embodiment-9, then, data stored in the reference cell is read into bit lines BL0 and /BL0, and these data are averaged to yield a reference potential.

After setting bit line BL0 at ground potential Vss, data stored in memory cell capacitor C00 is read into bit line BL0, and this is amplified by sense amplifier SA0. The memory cell and reference cell capacitors are rewritten afterward, and by this, the device operation is completed.

Embodiment-12 is identical with Embodiment-9 shown in FIG. 15 in respect that these operations are executed according to a serial operational timing shown here.

Opposite to the above shown order of operations, by setting precharge signal DP1 at "H" in the initial condition, the potential of reference cell capacitor C00D may well be set at reference cell potential Vcc, and the potential of reference cell C10D may be set at ground potential Vss, yielding the same results.

As described above, by using this embodiment of the invention, an arbitrary potential can be written in the reference cell capacitor through an external circuit. Since a definite potential is written always in the reference cell before its operation, stable data readout and writing operations can be performed.

Moreover, although ground potential Vss or power supply potential Vcc is used as the writing potential to the reference cell throughout the above explanation, this needs not be limited within said potentials, but any writing potential can be employed as well.

Embodiment-13

Figure 22:
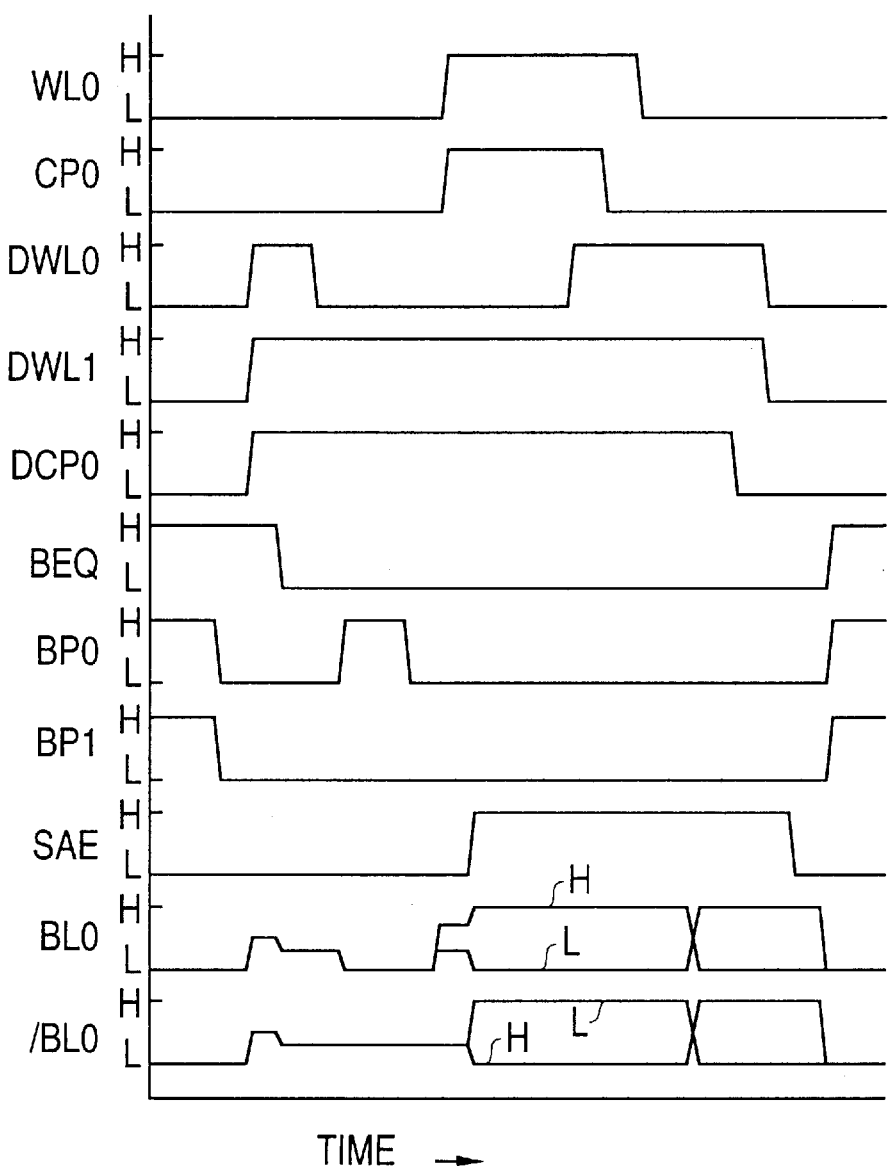
FIG. 22 shows an operational timing chart of semiconductor memory device which is a thirteenth embodiment of the invention.

FIG. 22 is an operational timing chart showing another type of operations of Embodiment-9. This type is particularly useful to extend the life of semiconductor memory device of which reference cell capacitors are made of ferroelectric capacitors.

The ferroelectric capacitor is highly advantageous in terms of its characteristics of spontaneous polarization by which data is held therein even when the power supply is cut off. However, when the number of repeated inversions of spontaneous polarization is exceeded a certain limit, deterioration of ferroelectric layer in which a logical potential of "H" is written becomes obvious decreasing the amount of stored charge. Since data in the reference cell has to be kept refreshed, this means that the life of semiconductor memory device is goverened by the life of reference cell.

In extending the capacitor life, the employment of alternative writing of logical potentials of "H" and "L" in reference cell capacitor had been found effective. By employing this, the life of reference cell in which "H" is normally written can be nearly doubled.

In the semiconductor memory device of Embodiment-9, the writing in the reference cell is performed through the bit lines. In this case, as shown in FIG. 22, word line WL0 is changed into "L" while word line DWL0 is held at "H" and the rewriting signal outputted from sense amplifier SA0 is reversed. This reversed signal is then written in the reference cell capacitor.

By employing this method, "H" and "L" are written alternatively in the reference cell capacitor and thus, the life of semiconductor memory device can be roughly doubled.

Furthermore, in the semiconductor memory device with a dedicated circuit for external connection such as Embodiment-12 shown in FIG. 20, a switching curcuit by which the precharge signal DP0 and the precharge signal DP1 can be alternatively switched, is externally provided. By using this circuit, "H" and "L" can be written alternatively in the reference cell capacitor.

Embodiment-14

Figure 23:
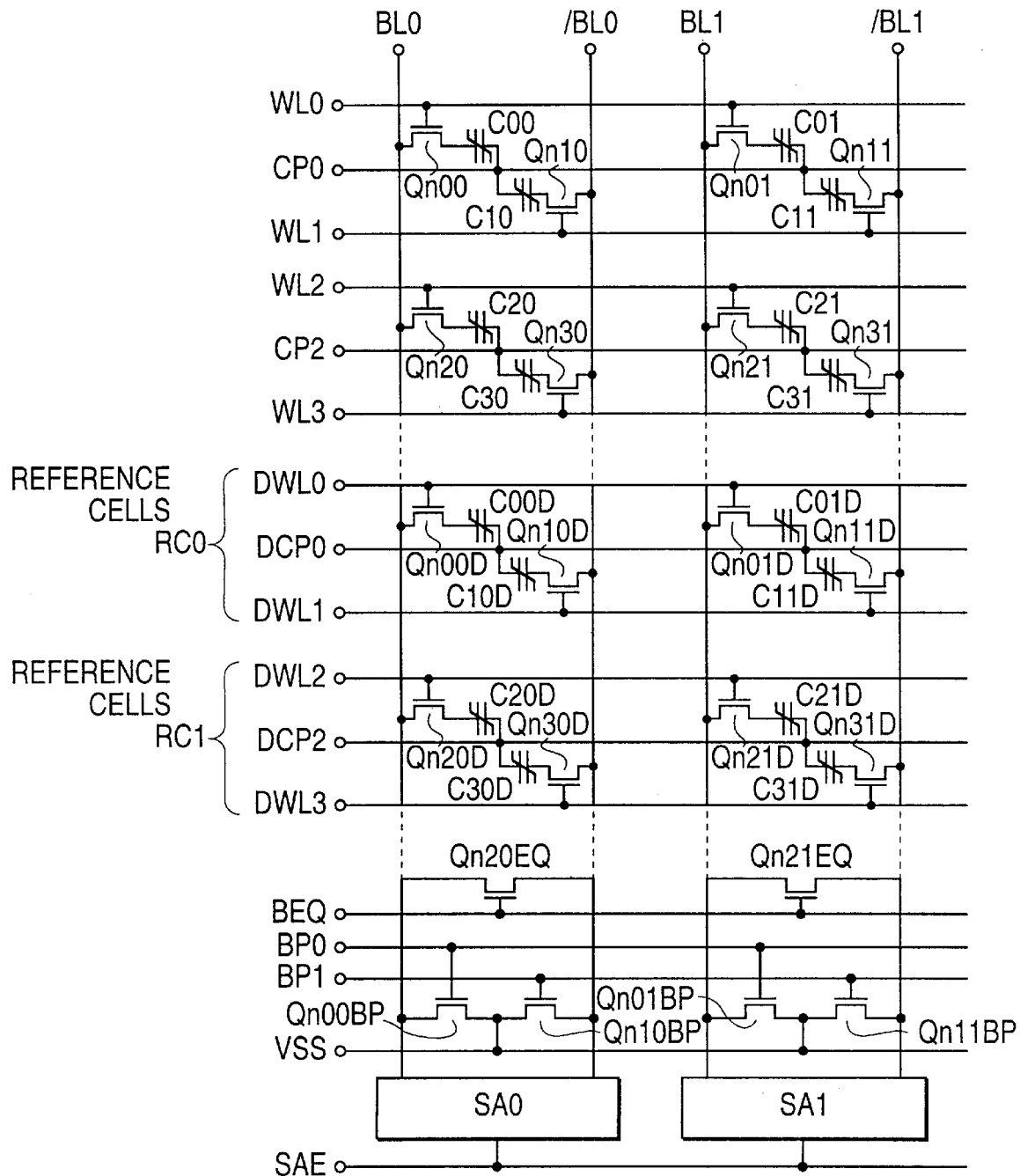
FIG. 23 shows a circuit construction of semiconductor memory device which is a fourteenth embodiment of the invention.

The semiconductor memory device shown in FIG. 23, i.e., Embodiment-14 is still another modification of Embodiment-9. Similar to Embodiment-13, this relates to a semiconductor memory device of which life is nearly doubled.

Embodiment-14 is different from Embodiment-9 shown in FIG. 14 in respect of two reference cells RC0 and RC1 disposed in Embodiment-14 while only one reference cell is provided in Embodiment 9. Thus, the possible deterioration of ferroelectric layer due to repeated readout and writing operations can be prevented by either allocating each of the reference cells to a predetermined memory cell, or by alternative use of two reference cells.

For example, a case where four memory cells and eight word lines are disposed is now explained below.

Assumed a case where each of the reference cells RC0 and RC1 are allocated to predetermined word lines or memory cells respectively as shown in Table 1. When a particular word line is accessed as shown in Table 2, a reference cell corresponding to the word line is independently operated. Therefore, chances of reference cell capacitor remaining in a same state are substantially reduced, and the stresses applied on the ferroelectric layeres are dispersed, and thus, the life of ferroelectric capacitors can be largely extend.

TABLE 1

| Reference Cell | Corresponding Word Lines | | | |
|---|---|---|---|---|
| RC0 | WL0 | WL1 | WL4 | WL5 |
| RC1 | WL2 | WL3 | WL6 | WL7 |

TABLE 2

| Accessed Word Lines | Operated Reference Cells |
|---|---|
| WL6 | RC1 |
| WL1 | RC0 |

TABLE 2-continued

| Accessed Word Lines | Operated Reference Cells |
|---|---|
| WL0 | RC0 |
| WL3 | RC1 |
| WL3 | RC1 |
| WL7 | RC1 |
| WL4 | RC0 |
| WL2 | RC1 |
| WL5 | RC0 |
| WL6 | RC1 |
| . | . |
| . | . |
| . | . |

On the other hand, when two reference cell RC0 and RC1 are alternatively switched in use, reference cells RC0 and RC1 are operated alternatively as shown in Table 3. Therefore, the stresses on ferroelectric layers are also dispersed and the life of ferroelectric capacitors can be largely extended.

TABLE 3

| Accessed Word Lines | Operated Reference Cells |
|---|---|
| WL5 | RC0 |
| WL0 | RC1 |
| WL2 | RC0 |
| WL1 | RC1 |
| WL7 | RC0 |
| WL4 | RC1 |
| WL5 | RC0 |
| WL3 | RC1 |
| . | . |
| . | . |
| . | . |

Embodiment-15

Figure 24:
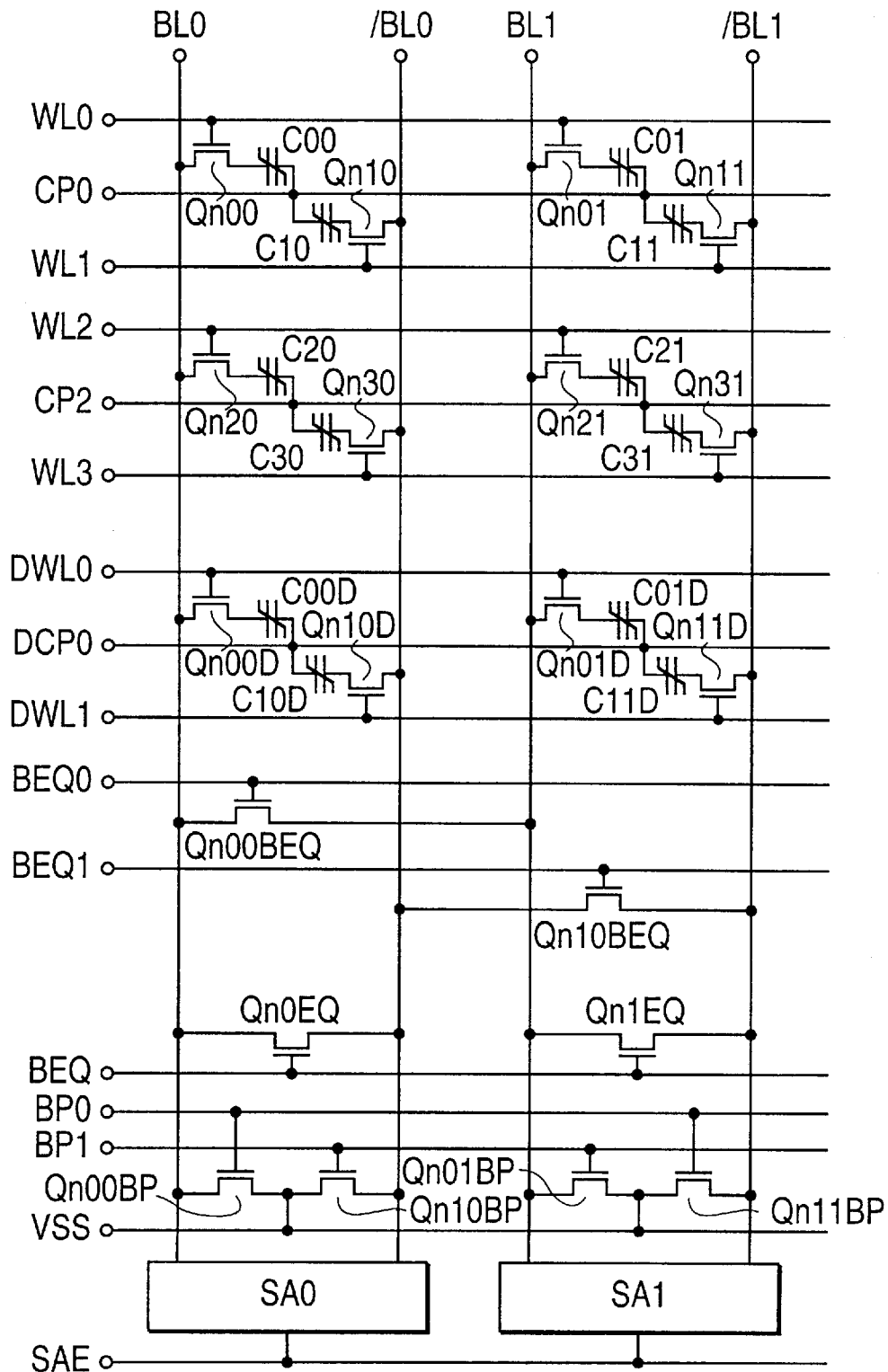
FIG. 24 shows a circuit construction of semiconductor memory device which is a fifteenth embodiment of the invention.

The semiconductor memory device shown in FIG. 24, i.e., Embodiment 15, is still another modification of Embodiment-9. This is provided with a compensation circuit compensating the deviation of reference potential caused by the ON-OFF operations of MOS transistors connected to bit lines.

Embodiment-15 is different from Embodiment-9 in respect to that bit lines BL0 and BL1 are connected together by MOS transistor Qn00BEQ controlled by equalizing signal BEQ0, and bit lines /BL0 and /BL1 are connected together by MOS transistor Qn10BEQ controlled by equalizing signal BEQ1.

Figure 25:
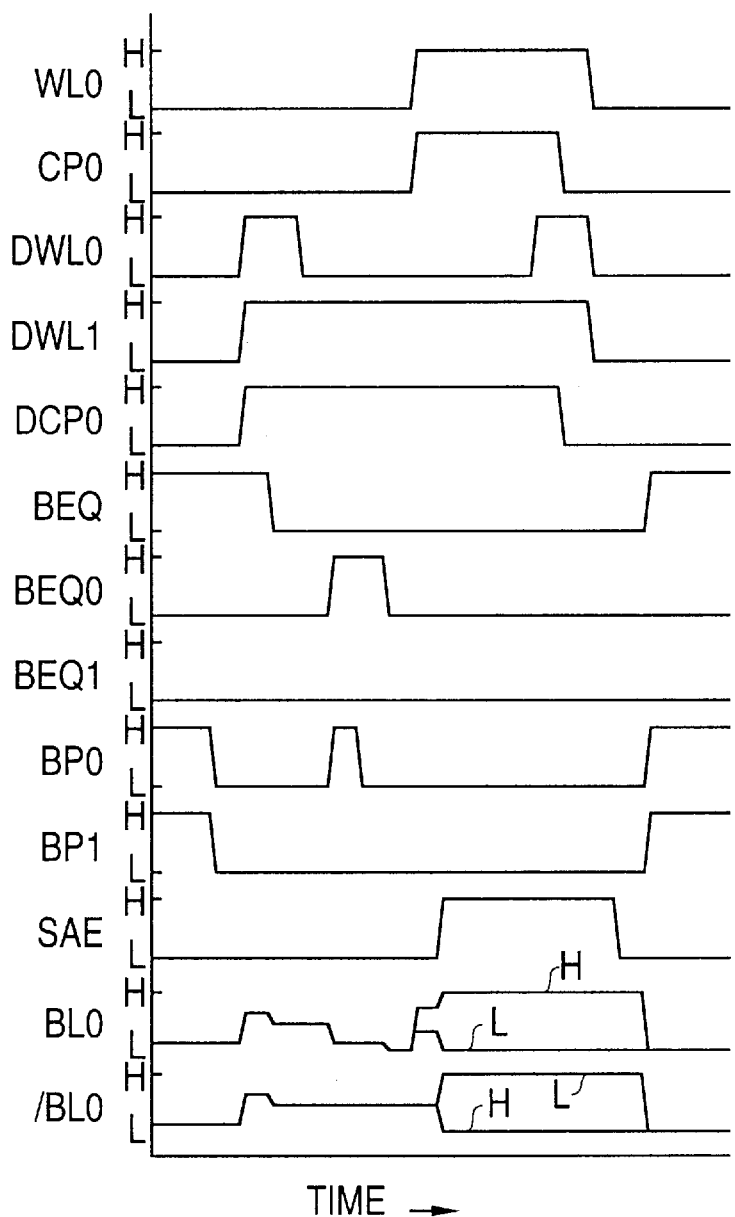
FIG. 25 shows an operational timing chart thereof.

The operation of this semiconductor memory devices is now explained below by referring FIG. 25. However, its operational timings are identical with those of Embodiment-9 shown in FIG. 15 except equalizing signals BEQ, BEQ0 and BEQ1.

Therefore, omitting the explanation for the identical parts, only the operations related to equalizing signals BEQ, BEQ0 and BEQ1 are explained here.

At an initial state before the data stored in the memory cell constituted of MOS transistor Qn00 and memory cell capacitor C00 is readout, equalizing signal BEQ is in a logical stage of "H". Therefore, an operation same as the one performed in Embodiment-9 shown in FIG. 15 is performed at first in order to generate a reference potential in bit lines BL0 and /BL0.

Then, MOS transistor QnoEQ is set at OFF by setting equalizing signal BEQ at a logical stage of "L". At this time, deviations of load capacitances of bit lines BL0 and /BL0 are produced, causing potential deviations in both bit lines. However, these potential deviations are compensated by talking a later explained procedure.

Then, MOS transistor Qn00BP is set at ON by setting precharge signal BP0 at "H" and bit line BL0 at ground potential Vss, and MOS transistor Qn00BEQ is set at ON by setting equalizing signal BEQ0 at "H", and bit line BL0 is connected to bit line BL1. At this time, the operations same as the ones conducted for bit lines BL1 and /BL1 also, and bit line BL1 is set at ground potential Vss.

Bit lines BL0 and BL1 are then set at ground potential Vss and floating conditions, and MOS transistor Qn00BEQ is set at OFF by setting equalizing signal BEQ0 at "L". By this, bit line BL0 is disconnected from bit line BL1. At this time, a potential deviation same as the one produced when bit line BL0 is disconnected from bit line /BL0 is produced in bit lines BL0 and BL1 also.

Then, the data stored in memory cell capacitor C00 is read in bit line BL0 by setting word line WL0 and cell plate electrode CP0 at "H". At this time, since the potential of bit line BL0 is decreased, the potential of reaout data is decreased by that amount. Thus the decreased reference potential is compensated by this. Moreover, further explanations are omitted since the amplification by sense amplifier and the data rewriting operations are identical with those shown in Embodiment-9.

As above descrived, in Embodiment-15, the load capacitance can be adjusted by connecting another bit line to the predetermined bit line, and the deviation of potential can be compensated by utilizing the potential change produced in the bit line so that erratic readout and rewriting operations can be prevented.

Embodiment-16

Figure 26:
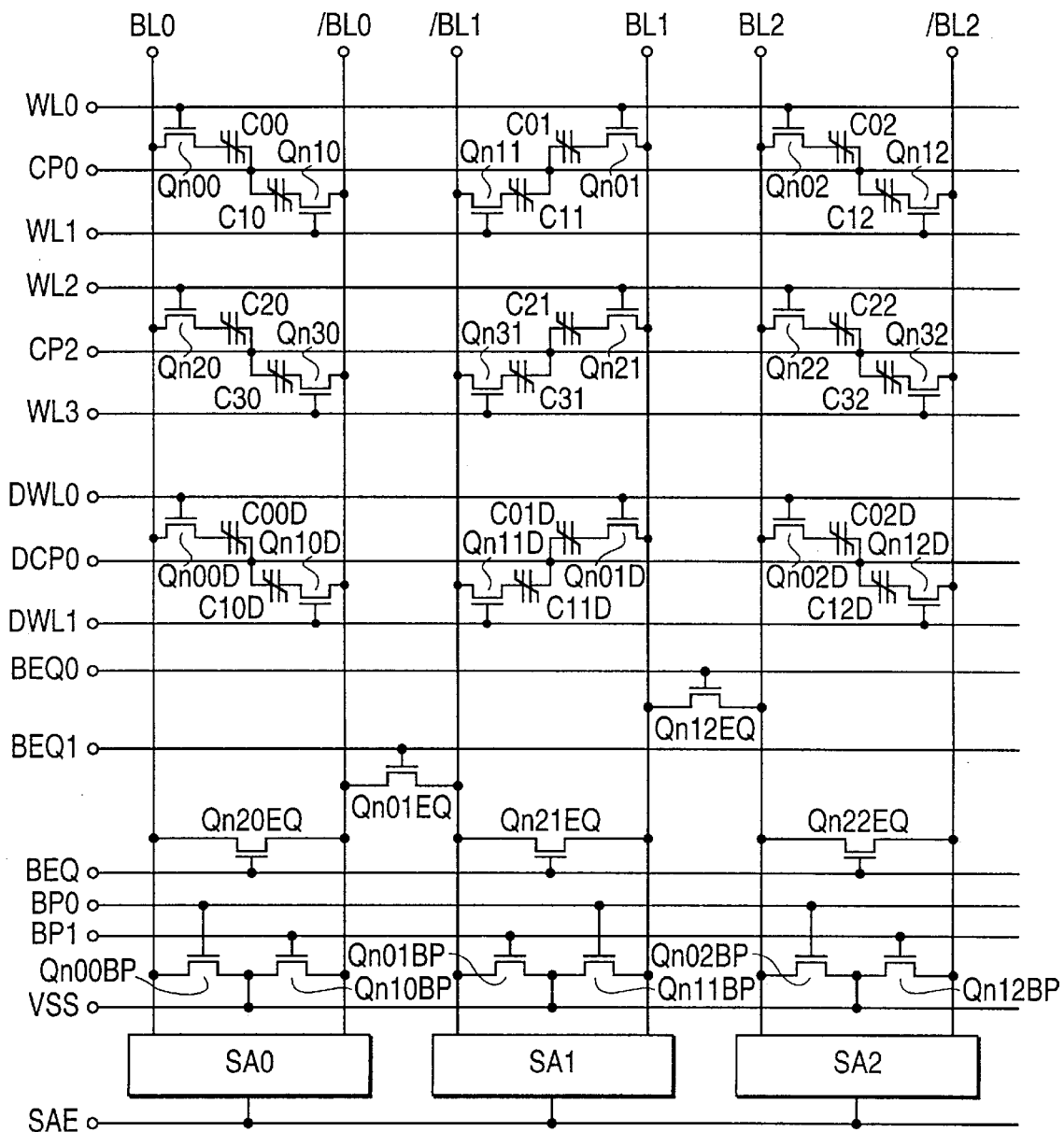
FIG. 26 shows a circuit construction of semiconductor memory device which is a sixteenth embodiment of the invention.
Figure 27:
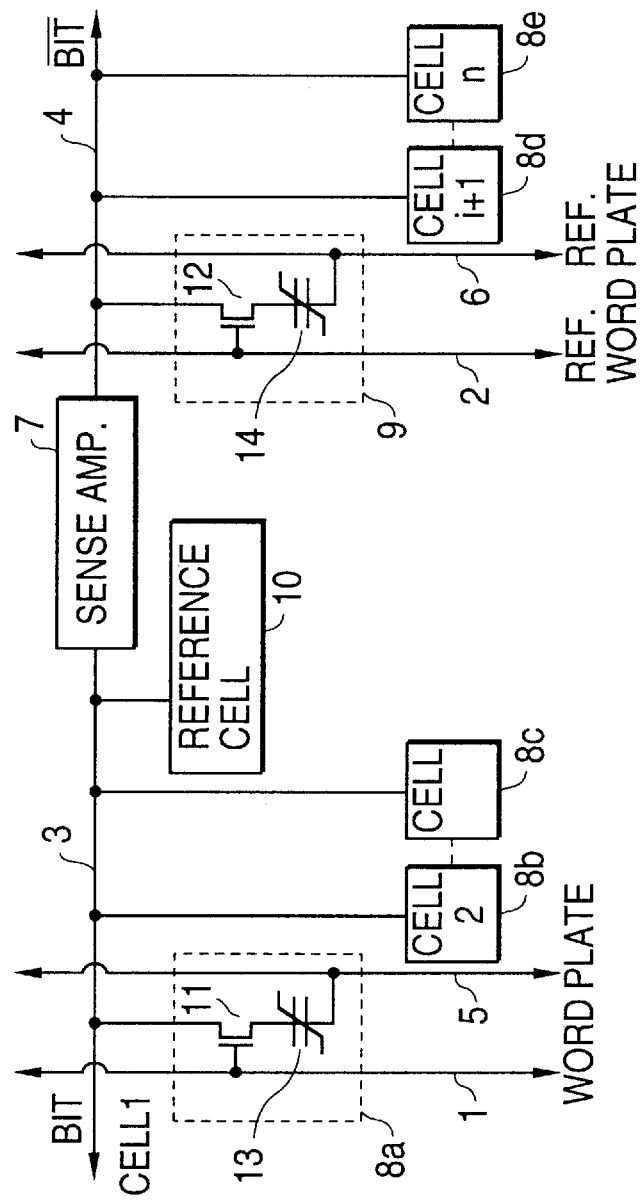
FIG. 27 shows a circuit construction of conventional semiconductor memory device.
Figure 28:
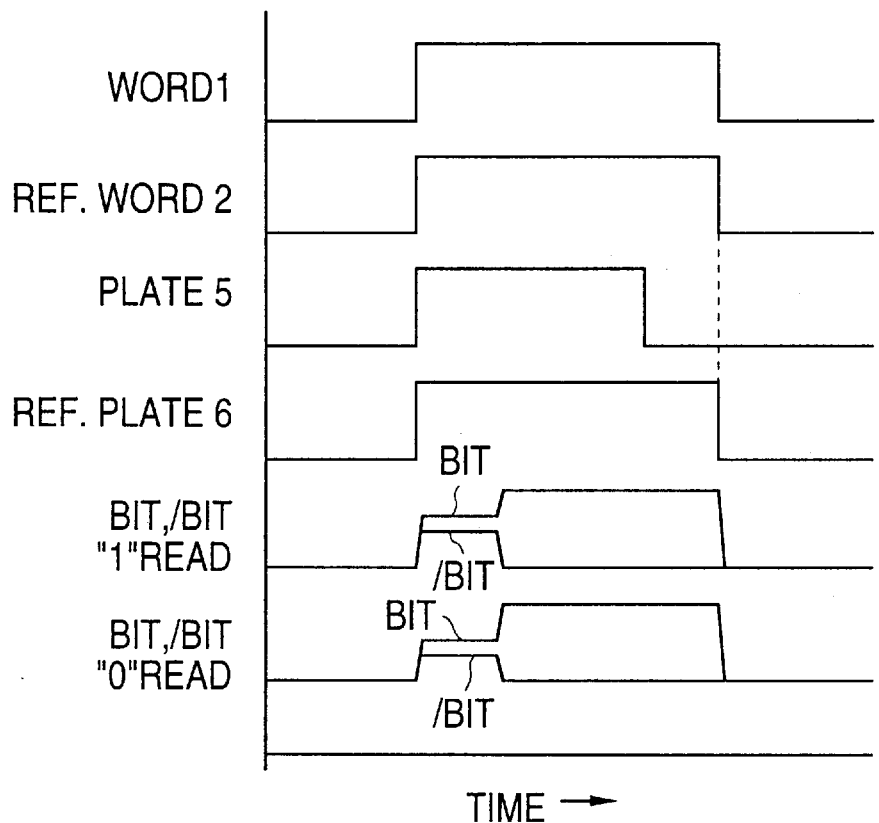
FIG. 28 shows an operational timing chart thereof.
Figure 29:
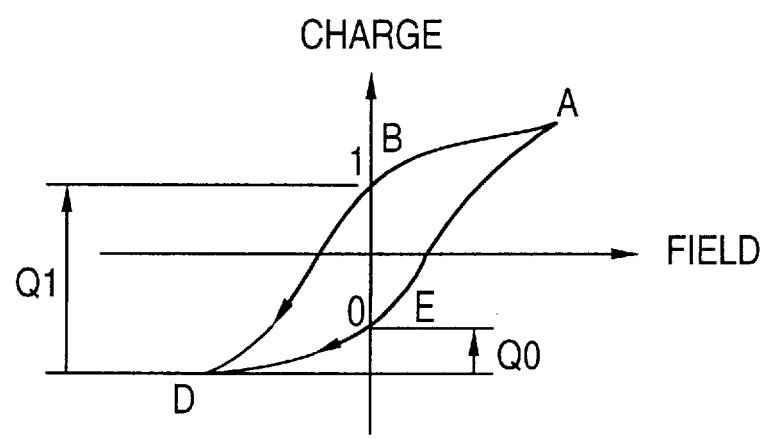
FIG. 29 shows a hysteresis characteristics of ferroelectric memory cell capacitor thereof.
Figure 30:
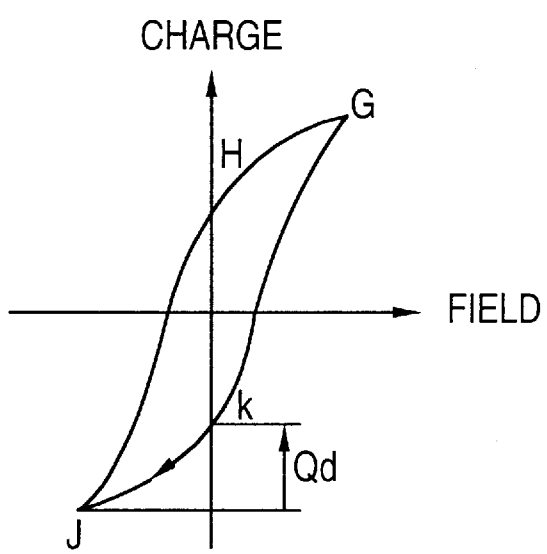
FIG. 30 shows a hysteresis characteristics of ferroelectric reference cell capacitor thereof.

The semiconductor memory device shown in FIG. 26, i.e., Embodiment 16, is still another modification of Embodiment-9, and this is disposed with a compensation circuit different from that of Embodiment-15.

Embodiment-16 is different from Embodiment-9 shown in FIG. 14 in respect to the paired bit lines connected together by MOS transistor Qn12EQ (Qn01EQ) which is controlled by equalizing signal BEQ0 (BEQ1). In this case, MOS transistor Qn12EQ is set at ON by setting equalizing signal BEQ0 at "H" in order to connect bit lines BL1 and BL2 together. In this condition, the MOS transistors Qn11BP and Qn02BP are set at ON by setting precharge signal BP0 at "H" in order to connect bit lines BL1 and BL2 to ground potential Vss.

Then, MOS transistor Qn12EQ is set at OFF by setting equalizing signal BEQ0 at "L" in order to disconnect bit line BL1 from bit line BL2. By these operations, the potential of bit line BL0 is varied by the amount of its load capacitance deviation. Therefore, the deviation of bit line potential produced at the generation of reference potential can be compensated by this.

As described in above, the load capacitance can be adjusted by connecting another bit line to a bit line, and the deviation of reference potential can be compensated by utilizing the deviation of bit line potential produced by this. Therefore, the possibilities of erratic data readout and rewriting can be prevented.

The present invention is not necessarily be limited within a scope of above described embodiments, but the true spirit and the modifications of the invention should be included within the range of the claims of the invention.

What is claimed is:

1. A semiconductor memory device comprising:
   a memory cell;
   a first bit line and a second bit line operative to read out data stored in said memory cell;

a third bit line and a fourth bit line for providing a reference potential;

a reference potential generating means which comprises a charge supplying means operative for supplying a charge to said third and fourth bit lines; first connecting means having a switching function for coupling said third bit line and said charge supplying means and for coupling said fourth bit line and said charge supplying means; and a second connecting means having a switching function for coupling said third bit line and said fourth bit line; and a sense amplifier which utilizes said first bit line and said second bit line as its input and output lines, wherein said memory cell and said charge supplying means comprise circuits in which capacitors of same design are incorporated, and said second connecting means is operative for equalizing the potential of said third and fourth bit lines by connecting said third and fourth bit lines to each other after said charge supplying means supplies a charge to said third and fourth bit lines.

2. The semiconductor memory device according to claim 1, wherein said capacitors consist of a capacitor in which "H" is written and a capacitor in which "L" is written.

3. The semiconductor memory device according to claim 1, wherein said capacitors consist of ferroelectric capacitors.

4. The semiconductor memory device according to claim 2, wherein said capacitors of ferroelectric capacitors.

5. A semiconductor memory device comprising:

a memory cell;

a first bit line and a second bit line operative to read out data stored in said memory cell;

a third bit line and a fourth bit line for providing a reference potential; and a reference potential generating means which comprises
  a first charge supplying means operative for supplying a charge to said third bit line;
  a second charge supplying means operative for supplying a charge to said fourth bit line;
  a first connecting means having a switching function for coupling said third bit line and said first charge supplying means;
  a second connecting means having a switching function for coupling said fourth bit line and said second charge supplying means; and
  a third connecting means having a switching function for coupling said third bit line and said fourth bit line;

wherein said memory cell, said first charge supplying means and said second charge supplying means comprise circuits including capacitors of same design and said first charge supplying means supplies a "H" charge which is same as a charge to write "1" to said memory means and said second charge supplying means supplies a "L" charge which is same as a charge to write "0" to said memory means.

6. A semiconductor memory device according to claim 5, wherein said capacitors are consisted of ferroelectric capacitors.

* * * * *